(12) United States Patent
Tatebe et al.

(10) Patent No.: US 10,760,175 B2
(45) Date of Patent: Sep. 1, 2020

(54) WHITE ANODIC FILMS WITH MULTIPLE LAYERS

(71) Applicant: Apple Inc., Cupertino, CA (US)

(72) Inventors: Masashige Tatebe, Kakogawa (JP); Takahiro Oshima, Tokyo (JP); Jody R. Akana, San Francisco, CA (US); Yutaka Nakagishi, Iga (JP); Junichi Katayama, Kyoto (JP); Kenji Hara, Nara (JP); Yasuhiro Ito, Otsu (JP); Ayumi Hongou, Kyoto (JP)

(73) Assignee: APPLE INC., Cupertino, CA (US)

( * ) Notice: Subject to any disclaimer, the term of this patent is extended or adjusted under 35 U.S.C. 154(b) by 252 days.

(21) Appl. No.: 15/333,070

(22) Filed: Oct. 24, 2016

(65) Prior Publication Data

US 2017/0121836 A1    May 4, 2017

Related U.S. Application Data

(60) Provisional application No. 62/249,079, filed on Oct. 30, 2015.

(51) Int. Cl.
*C25D 11/22* (2006.01)
*C25D 11/16* (2006.01)
(Continued)

(52) U.S. Cl.
CPC .............. *C25D 11/22* (2013.01); *C25D 11/08* (2013.01); *C25D 11/10* (2013.01); *C25D 11/12* (2013.01);
(Continued)

(58) Field of Classification Search
CPC .......... C25D 11/12; C25D 11/14; C25D 11/22
See application file for complete search history.

(56) References Cited

U.S. PATENT DOCUMENTS

| 2,231,373 A | 2/1941 | Max |
| 3,382,160 A | 5/1968 | Tahei |

(Continued)

FOREIGN PATENT DOCUMENTS

| AT | 262714 B | 6/1968 |
| CH | 221939 A | 6/1942 |

(Continued)

OTHER PUBLICATIONS

English language translation of JPS62-20896A, generated on Jan. 31, 2019 with Espacenet website (https://www.epo.org/searching-for-patents/technical/espacenet.html#tab-1) *Paragraph Nos. added by Examiner.*

(Continued)

*Primary Examiner* — Mark Ruthkosky
*Assistant Examiner* — Julia L Rummel
(74) *Attorney, Agent, or Firm* — Dorsey & Whitney LLP

(57) ABSTRACT

Anodic films that have a white color, and methods for forming the same, are described. According to some embodiments, the anodic films have multiple metal oxide layers. A first layer can provide scratch and chemical resistance and a second layer can provide a light diffusing pore structure that diffusely reflects incoming light and provides a white appearance to the anodic film. According to some embodiments, the anodic films also include a smoothed barrier layer that specularly reflects incoming light so as to brighten the appearance and enhance the white color of the anodic film. The resulting anodic films have an opaque white appearance not achievable using conventional techniques. The anodic films are well suited for providing cosmetically appealing coatings for consumer products, such as housings for electronic products.

20 Claims, 16 Drawing Sheets

(51) Int. Cl.
  *C25D 11/24* (2006.01)
  *C25F 3/20* (2006.01)
  *H05K 5/02* (2006.01)
  *H05K 5/04* (2006.01)
  *C25D 11/08* (2006.01)
  *C25D 11/10* (2006.01)
  *C25D 11/12* (2006.01)
  *C25D 11/06* (2006.01)
  *G06F 1/16* (2006.01)

(52) U.S. Cl.
  CPC ........... *C25D 11/16* (2013.01); *C25D 11/24* (2013.01); *C25F 3/20* (2013.01); *H05K 5/0243* (2013.01); *H05K 5/04* (2013.01); *C25D 11/06* (2013.01); *G06F 1/1633* (2013.01)

(56) References Cited

U.S. PATENT DOCUMENTS

| | | |
|---|---|---|
| 3,524,799 A | 8/1970 | Dale |
| 3,798,193 A | 3/1974 | Parehk et al. |
| 3,844,908 A | 10/1974 | Matsuo et al. |
| 3,962,049 A * | 6/1976 | Ueki .................. C25D 11/22 205/106 |
| 4,066,816 A | 1/1978 | Sheasby et al. |
| 4,251,330 A | 2/1981 | Sheasby et al. |
| 4,310,586 A | 1/1982 | Sheasby et al. |
| 4,526,671 A | 7/1985 | Watanabe et al. |
| 4,606,796 A | 8/1986 | Hanazima et al. |
| 4,687,551 A | 8/1987 | Furneaux et al. |
| 4,702,955 A | 10/1987 | Allred et al. |
| 4,773,717 A | 9/1988 | Pai et al. |
| 5,066,368 A | 11/1991 | Pasqualoni et al. |
| 5,124,172 A | 6/1992 | Burrell et al. |
| 5,167,793 A | 12/1992 | Jozefowicz |
| 5,218,472 A | 6/1993 | Jozefowicz et al. |
| 5,250,173 A | 10/1993 | Jozefowicz |
| 5,277,982 A | 1/1994 | Jozefowicz |
| 5,472,788 A | 12/1995 | Benitez-Garriga |
| 5,510,015 A | 4/1996 | Martinez et al. |
| 5,800,693 A * | 9/1998 | Kakizaki .............. C25D 11/30 205/321 |
| 5,904,989 A | 5/1999 | Hanggi et al. |
| 6,027,629 A | 2/2000 | Hisamoto et al. |
| 6,379,523 B1 | 4/2002 | Takabayashi |
| 7,173,276 B2 | 2/2007 | Choi et al. |
| 7,715,086 B2 | 5/2010 | Yamamoto et al. |
| 7,922,889 B2 | 4/2011 | Critchlow et al. |
| 8,377,561 B2 | 2/2013 | Binder et al. |
| 8,828,553 B2 | 9/2014 | Khosla |
| 9,353,454 B2 | 5/2016 | Shen et al. |
| 9,512,536 B2 | 12/2016 | Tatebe et al. |
| 9,512,537 B2 | 12/2016 | Tatebe et al. |
| 2002/0182538 A1 | 12/2002 | Tomita et al. |
| 2005/0029115 A1 | 2/2005 | Kuo et al. |
| 2005/0221712 A1 | 10/2005 | Yasui et al. |
| 2006/0019035 A1 | 1/2006 | Munz et al. |
| 2008/0213618 A1 | 9/2008 | Critchlow et al. |
| 2008/0274375 A1 | 11/2008 | Ng et al. |
| 2009/0247668 A1 | 10/2009 | Sumitomo et al. |
| 2010/0276288 A1 | 11/2010 | Hovestad et al. |
| 2012/0073973 A1 | 3/2012 | Yamashita et al. |
| 2013/0078399 A1 | 3/2013 | Yu et al. |
| 2013/0081952 A1 | 4/2013 | Akimoto et al. |
| 2013/0153428 A1 | 6/2013 | Akana et al. |
| 2013/0153429 A1 | 6/2013 | Khosla |
| 2013/0168253 A1 | 7/2013 | Mardilovich et al. |
| 2013/0192588 A1 | 8/2013 | Ostermann |
| 2013/0313247 A1* | 11/2013 | Rubio .................. A47J 36/02 219/621 |
| 2014/0076600 A1 | 3/2014 | Browning et al. |
| 2014/0117840 A1* | 5/2014 | Hatanaka .............. H01L 33/60 313/498 |
| 2014/0193607 A1 | 7/2014 | Browning et al. |
| 2014/0209467 A1 | 7/2014 | Miao et al. |
| 2014/0262790 A1 | 9/2014 | Levendusky et al. |
| 2015/0016030 A1 | 1/2015 | Browning et al. |
| 2015/0090598 A1 | 4/2015 | Tatebe et al. |
| 2015/0176146 A1 | 6/2015 | Browning et al. |
| 2015/0277097 A1 | 10/2015 | Hong et al. |
| 2015/0368823 A1 | 12/2015 | Curran et al. |
| 2016/0312374 A1 | 10/2016 | Duffy et al. |
| 2017/0016136 A1 | 1/2017 | Yamamoto et al. |
| 2017/0044684 A1 | 2/2017 | Tatebe et al. |
| 2017/0121837 A1 | 5/2017 | Tatebe et al. |
| 2017/0121838 A1 | 5/2017 | Tatebe et al. |

FOREIGN PATENT DOCUMENTS

| | | |
|---|---|---|
| CN | 102834551 B | 7/2015 |
| DE | 102008011298 A1 | 9/2008 |
| EP | 0975827 B9 | 7/2004 |
| EP | 2589686 A1 | 5/2013 |
| EP | 2649224 B1 | 3/2016 |
| EP | 1432849 B1 | 5/2016 |
| EP | 3017093 A1 | 5/2016 |
| EP | 3017094 A1 | 5/2016 |
| JP | 52087364 A | 7/1977 |
| JP | 57092194 A | 6/1982 |
| JP | S5792194 A | 6/1982 |
| JP | S6220896 A | 1/1987 |
| JP | S62-20896 A * | 7/1987 ........... B29C 65/086 |
| JP | S62263996 A | 11/1987 |
| JP | H06200399 A | 7/1994 |
| JP | 09143795 A | 6/1997 |
| JP | 11001797 A | 1/1999 |
| JP | 2005060720 A | 3/2005 |
| JP | 2006057493 A | 3/2006 |
| JP | 2007314840 A | 12/2007 |
| JP | 2007325995 A | 12/2007 |
| JP | 2008223073 A | 9/2008 |
| JP | 2009248485 A | 10/2009 |
| JP | 2009256778 A | 11/2009 |
| JP | 2015161012 A | 9/2015 |
| TW | I496955 B | 8/2015 |
| WO | 1991002830 A1 | 3/1991 |
| WO | 1992019795 A1 | 11/1992 |
| WO | 2001018281 A1 | 3/2001 |
| WO | 2012119306 A1 | 9/2012 |
| WO | 2015047634 A1 | 4/2015 |
| WO | 2015047635 A1 | 4/2015 |
| WO | 2015199639 A1 | 12/2015 |

OTHER PUBLICATIONS

EasyRGB "Convert color data into different standards and color spaces", p. 1-2; Accessed on Feb. 6, 2019 at https://www.easyrgb.com/en/convert.php#inputFORM.*
Product Data Sheet on titanium dilactate ammonium salt accessed from http://www.sigma-aldrich.com on Jun. 10, 2015.
International Search Report & Written Opinion—Application No. PCT/US2014/043601 dated Apr. 29, 2015.
Gils. S. V. et al., "Colour properties of barrier anodic oxide films on aluminum and titanium studied with total reflextance and spectroscopic ellipsometry." Surface & Coatings Technology, vol. 185, pp. 303-310 (2004).
Shih, T. S. et al., "Optical properties of anodic aluminum oxide films on A11050 alloys," Surface & Coatings Technology, vol. 202, pp. 3298 3305 (2008).
Parkhutik et al.Theoretical Modelling of Porous Oxide Growth on Aluminum J. Phys. D: Appl. Phys. 25, pp. 1258-1263 (1992).
International Search Report & Written Opinion—Application No. PCT/US2014/052843, dated Dec. 11, 2014.
Grubbs, Charles A., "Anodizing of Aluminum" Houghton Metal Finishing, Alpharetta, GA. Jan. 2001, p. 476-493.
PCT Patent Application No. PCT/US2016/058529—International Search Report and Written Opinion dated Aug. 30, 2017.
Taiwanese Patent Application. No. 105216517—Technical Evaluation Report dated May 8, 2018.

(56) References Cited

OTHER PUBLICATIONS

Chinese Application for Invention No. 201480047233.5—Third Office Action dated Jun. 21, 2018.
Japanese Patent Application No. 2016-544340—Office Action dated Jan. 27, 2017.
Taiwanese Patent Application. No. 103129614—Office Action dated Jun. 22, 2015.
European Patent Application No. 14848872.9—Extended European Search Report dated Apr. 19, 2017.
Database WPI, Week 198228 Thomson Scientific, London, GB; AN 1982-58655E—& JP S57 92194 A (Nippon Light Metal Co) Jun. 8, 1982.
German utility model application 20 2016 006 606.5—Extended Search Report dated Mar. 7, 2017.
F. Ostermann: Application Technology Aluminum. Berlin Heidelberg: Springer-Verlag, 1998.—ISBN 978-3-662-05789-6, pp. 113-114, chapter 5.2.1 1, 2, 6, and table 5.2.1 and pp. 9, 10, 14 526-528, chapter 19.4.1. (Concise explanation provided in English, from pp. 1-6.).
Chinese Application Patent Application No. 201480047233.5—Office Action dated Mar. 27, 2017.
Parkhutik et al.; "Theoretical modeling of porous oxide growth on aluminum", Minsk Radioengineering Institute, P. Brovki 6, 220600 Minsk, Belorussia, pp. 1258 to 1263, Mar. 2, 1992.
Australian innovation patent No. 2016101931—Examination Report No. 1, dated Dec. 14, 2016.
Chinese Application for Invention No. 201480047233.5—Second Office Action dated Dec. 13, 2017.
Chinese Patent Application No. 201680064003.9—First Office Action dated May 13, 2019.
Japanese Patent Application No. 2018-521261—Office Action dated Mar. 11, 2019.
Nissa, J .; "Fabrication of a Porous Alumina Membrane", 2013, Master's Thesis submitted to Lund University, p. 13-19.
ASTM, Designation: D 1141-98 (Re-approved 2003) Standard Practice for the Preparation of Substitute Ocean Water, 2003, p. 1-3.
ASTM, Designation: B117-18 Standard Practice for Operating Salt Spray (Fog) Apparatus, 2018, p. 1-12.

* cited by examiner

WHITE ANODIC FILMS WITH MULTIPLE LAYERS

CROSS REFERENCE TO RELATED APPLICATIONS

This application claims priority under 35 U.S.C. § 119(e) to U.S. Provisional Patent Application No. 62/249,079, filed Oct. 30, 2015, and entitled "ANODIZED FILMS WITH PIGMENT COLORING," which is incorporated herein by reference in its entirety and for all purposes.

Any publications, patents, and patent applications referred to in the instant specification are herein incorporated by reference in their entireties. To the extent that the publications, patents, or patent applications incorporated by reference contradict the disclosure contained in the instant specification, the instant specification is intended to supersede and/or take precedence over any such contradictory material.

FIELD

The described embodiments relate to anodized films having a white appearance and methods forming the same. More specifically, methods involve techniques for forming multiple-layered anodic film structures that result in a white appearing anodic film having high durability and chemical resistivity.

BACKGROUND

Anodizing is an electrochemical process that thickens a naturally occurring protective oxide on a metal surface. An anodizing process involves converting part of a metal surface to an anodic film. Thus, an anodic film becomes an integral part of the metal surface. Due to its relative hardness, an anodic film can provide corrosion resistance and wear protection for an underlying metal. In addition, an anodic film can enhance a cosmetic appearance of a metal surface. For example, anodic films can have a porous microstructure that can be infused with dyes to impart a desired color to the anodic films.

Conventional methods for coloring anodic films, however, have not been able to achieve an anodic film with an opaque and saturated white appearance. In particular, the underling metal substrate can often be seen through the anodic film such that the anodized substrate appears to have a silver or metallic appearance. Thus, conventional techniques result in films that appear to be off-white or have a grey or silver hue. What is needed are improved methods for forming white appearing anodic films.

SUMMARY

This paper describes various embodiments that relate to white anodized films and methods for forming white anodized films. The colored anodized films can have an opaque white appearance.

According to one embodiment, a method of forming a white appearing metal oxide film is described. The method includes forming a first layer of the metal oxide film by anodizing a substrate in a first electrolyte. The method also includes forming a second layer of the metal oxide film by anodizing the substrate in a second electrolyte different than the first electrolyte. The second layer is more porous than the first layer and has pore wall surfaces that diffusely reflect visible light incident an exterior surface of the metal oxide film so as to impart the white appearance to the metal oxide film.

According to another embodiment, an anodized substrate having a white appearance is described. The anodized substrate has an anodic coating including a first metal oxide layer having an exterior surface corresponding to an exterior surface of the anodized substrate. The anodic coating also includes a second metal oxide layer adjacent the first metal oxide layer. The second metal oxide layer is more porous than the first metal oxide layer and has pore wall surfaces that diffusely reflect visible light incident an exterior surface of the anodic coating so as to impart a white appearance to the anodic coating.

According to a further embodiment, an enclosure for an electronic device is described. The enclosure includes an aluminum alloy substrate. The enclosure also includes an anodic coating having a white appearance disposed on the aluminum alloy substrate. The anodic coating has a first metal oxide layer, a second metal oxide layer adjacent the first metal oxide layer, and a barrier layer. The second metal oxide layer pore wall structure that diffusely reflects incident visible light. The barrier layer is positioned between the second metal oxide layer and the aluminum alloy substrate, wherein a thickness of the barrier layer is between about 150 nanometers and about 800 nanometers.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
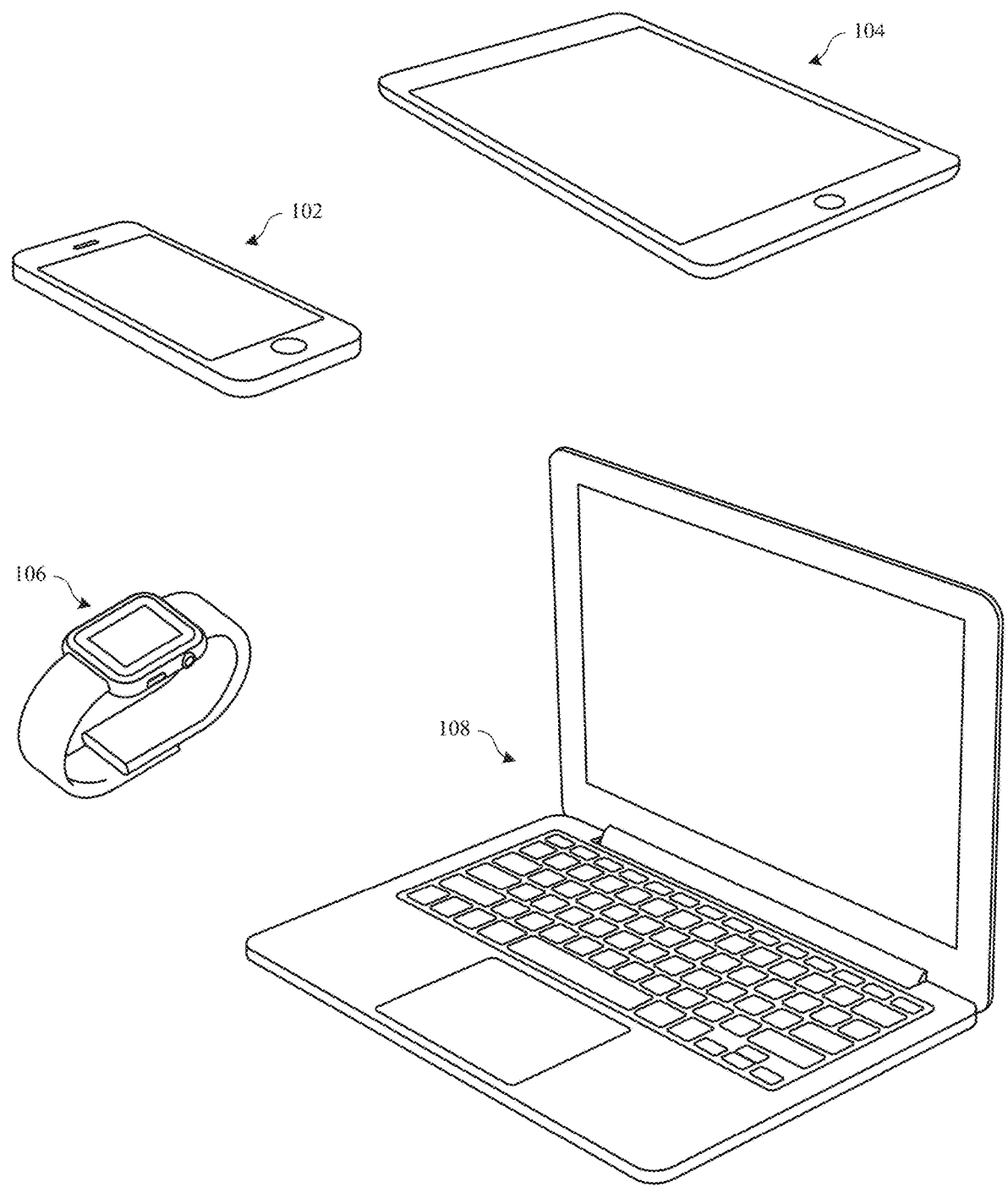
FIG. 1 shows perspective views of devices having metallic surfaces that can be protected using anodic oxide coatings described herein.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Described herein are processes for providing a white color to anodic films. In particular embodiments, the anodic films have multiple layers, where a first layer, which can correspond to an outer or external layer of the anodic film, has a relatively high density of metal oxide material, thereby providing a hardness and chemical resistivity to the anodic film. A second layer, beneath the first layer, can include a pore wall structure that diffusely reflects incoming visible light, thereby providing a white appearance to the anodic film. The pore wall structure of the second layer can include pore wall surfaces that are at non-orthogonal orientations with respect to the outer surface of the anodic film, thereby providing a structure for diffusely reflecting incident light. In some cases, the anodic films include a smoothed barrier layer that defines a flat interface surface between the barrier layer and an underlying substrate. The flat interface surface can specularly reflect incoming light, thereby increasing a brightness and enhancing the white appearance of the multiple layered anodic film. The barrier layer smoothing process can also flatten pore terminuses of the second layer, thereby providing additional flat surfaces for specularly reflecting incoming light.

Methods for forming the multiple layered anodic films can include performing a first anodizing process using a first electrolyte and a second anodizing process using a second electrolyte different than the first electrolyte. In some embodiments, the first electrolyte includes oxalic acid, which can form a dense and chemically resistant first layer. In some embodiments, the first electrolyte includes sulfuric acid, which can form a substantially colorless and cosmetically appealing anodic film. In some embodiments, the second electrolyte includes phosphoric acid, which can form an irregular pore structure that includes light diffusing pore walls. The second anodizing process can result in a more porous second layer than the first anodizing process. In embodiments where a barrier layer smoothing process is used, the anodic film can be exposed to a third anodizing process that is performed in a non-dissolution (i.e., non-pore forming) electrolyte. In particular embodiments, the non-pore forming electrolyte includes borax or boric acid. The multiple layered anodic film can be sealed using a sealing process so as to further increase its chemical resistance and the corrosion resistance. The resultant white appearing anodic film can have a hardness of at least 150 HV (Vickers Pyramid Number as measured using Vickers hardness test) in order to withstand abrasion forces that may occur during normal use of a consumer product (e.g., an electronic device as described above). The resultant white appearing anodic film can also be characterized as having an L* value of at least 80 (in some cases at least 85), a b* value between about −3 and about +6, and an a* value of between about −3 and about +3. In some embodiments, a suitable white color can be achieved without infusing a dye or pigment within the multiple layered anodic film. In some embodiments, a suitable white color is achieved by infusing a dye or pigment within the multiple layered anodic film.

The present paper makes reference to anodizing of aluminum and aluminum alloy substrates. It should be understood, however, that the methods described herein may be applicable to any of a number of other suitable anodizable metal substrates, such as suitable alloys of magnesium. As used herein, the terms anodized film, anodized coating, anodic oxide, anodic coating, anodic film, anodic layer, anodic coating, anodic oxide film, anodic oxide layer, anodic oxide coating, metal oxide film, metal oxide layer, metal oxide coating, oxide film, oxide layer, oxide coating etc. can be used interchangeably and can refer to suitable metal oxides, unless otherwise specified.

Methods described herein are well suited for providing cosmetically appealing surface finishes to consumer products. For example, the methods described herein can be used to form durable and cosmetically appealing finishes for housing for computers, portable electronic devices, wearable electronic devices, and electronic device accessories, such as those manufactured by Apple Inc., based in Cupertino, Calif.

These and other embodiments are discussed below with reference to FIGS. 1-11B. However, those skilled in the art will readily appreciate that the detailed description given herein with respect to these Figures is for explanatory purposes only and should not be construed as limiting.

The methods described herein can be used to form durable and cosmetically appealing coatings for metallic surfaces of consumer devices. FIG. 1 shows consumer products that can be manufactured using methods described herein. FIG. 1 includes portable phone 102, tablet computer 104, smart watch 106 and portable computer 108, which can each include housings that are made of metal or have metal sections. Aluminum alloys, such as 5000 series, 6000 series or 7000 series aluminum alloys, can be a choice metal material due to their light weight and ability to anodize and form a protective anodic oxide coating that protects the metal surfaces from scratches. In some cases the anodic oxide coatings are colorized to impart a desired color to the metal housing or metal sections.

Conventional anodic oxide coloring techniques involve infusing dyes, such as organic dyes or metal-based colorants, within the pores of the anodic oxide. It can be difficult, however, to impart an opaque white appearance to anodic oxide coatings. This is, in part, because white colorants can be composed of relatively large particles that can be difficult to infuse within the nano-scale diameter pores of anodic oxide coatings. Conventional colorizing techniques often result in off-white or silver colored anodic oxide coatings. This is because the underlying metal substrate can still be observable through the anodic oxide such that the anodic oxide finish retains a metallic look. Described herein are improved techniques for providing opaque white anodic oxide finishes to metal substrate, such as those on housing of devices 102, 104, 106 and 108.

In general, white is the color or appearance of an object if the material of the object diffusely reflects back most of visible light that strikes it. Non-dyed anodic oxide coatings may have a slight whitened or colored appearance, depending on the anodizing conditions and processing parameters for forming the anodic oxide coating. However, many types of non-dyed anodic oxide coating can be generally characterized as translucent in that the underlying metal substrate is typically clearly visible through the non-dyed anodic oxide coating.

Figure 2:
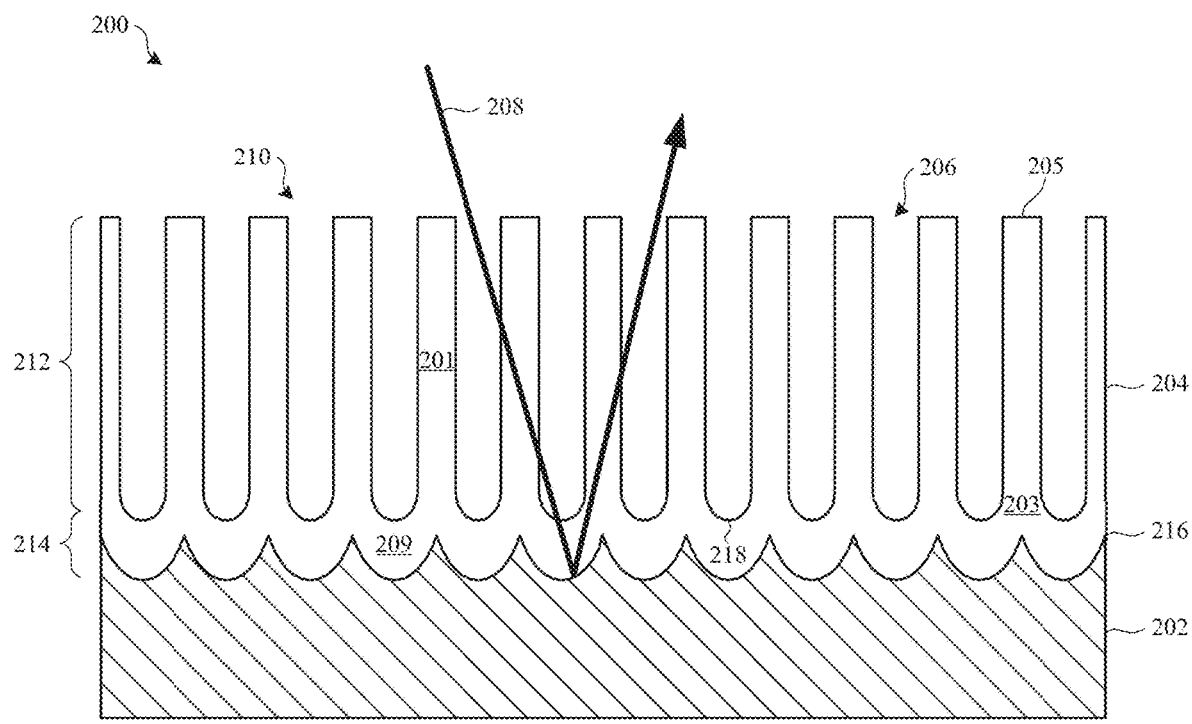
FIG. 2 shows a cross section view of an anodized part illustrating how an anodized part using a conventional anodizing process can have a translucent appearance.

To illustrate, FIG. 2 shows a cross section view of a surface portion of anodized part 200. Part 200 includes metal substrate 202 and metal oxide coating 204. Metal oxide coating 204 is composed of a metal oxide material 203 and includes pores 206 formed during the anodizing process. In this way, pores 206 are defined by pore walls 205, which are composed of metal oxide material 203. The size of pores 206 can vary depending on the anodizing process conditions. For example, some type II anodizing processes, as defined by MIL-A-8625 industry standards, which involve anodizing in a sulfuric acid bath, can result in pores 206 having diameters of about 20 nanometers (nm) to about 30 nanometers. Metal oxide coating 204 is uncolorized in that pores 206 do not include dye or metal colorants. Thus, much of the visible light incident metal oxide coating 204 can pass through metal oxide coating 204. For example, light ray 208 can enter outer surface 210 of metal oxide coating 204 and pass through metal oxide material 203 and pores 206, reflect off of underlying metal substrate 202, and reflect back out of metal oxide coating 204. In this way, underlying metal substrate 202 can be visible through metal oxide coating 204, thereby giving anodized part 200 a metallic look.

It should be noted that metal oxide coating 204 includes a porous layer 201 (defined by thickness 212), which includes pores 206 and a barrier layer 209, (defined by thickness 214), which corresponds to a generally non-porous portion of metal oxide coating 204 between metal substrate 202 and porous layer 201. Both porous layer 201 and the barrier layer 209 include metal oxide material 203 from converting surface portions of metal substrate 202 to a corresponding metal oxide material 203. Interface surface 216 of barrier layer 209, defined on one side by metal substrate 202 and on another side by barrier layer 209, has a shape that is partially defined by pore terminuses 218 of pores 206. In particular, the curved shaped pore terminuses 218 can cause interface surface 216 to have a scalloped geometry or shape. In three dimensions, interface surface 216 can be characterized as having a series of curved, hemispherical, cup-like features.

One of the challenges associated with imparting a white appearance to metal oxide coating 204 is that many white colorants, such as titanium oxide particles, can be too big to fit within pores 206. Thus, conventional methods can make it impossible to accomplish a visibly saturated, rich, highly opaque white color to metal oxide coating 204. Even when some whitening is accomplished, significant amounts of incoming light can still pass through metal oxide coating 204 so as to give part 200 a silver hue as viewed from surface 210. In addition, light incident metal oxide coating 204 can become trapped within metal oxide coating 204 due to the scalloped shaped interface surface 216, thereby darkening the appearance of metal oxide coating 204 and preventing a brightness necessary for a providing white appearance.

The methods described herein involve forming a multiple layered anodic coating that can provide a saturated, opaque and bright white appearance. FIGS. 3A-3E illustrate cross section views of part 300 undergoing an anodizing process for forming a white appearing multiple layered coating, in accordance with some described embodiments.

Figure 3A:
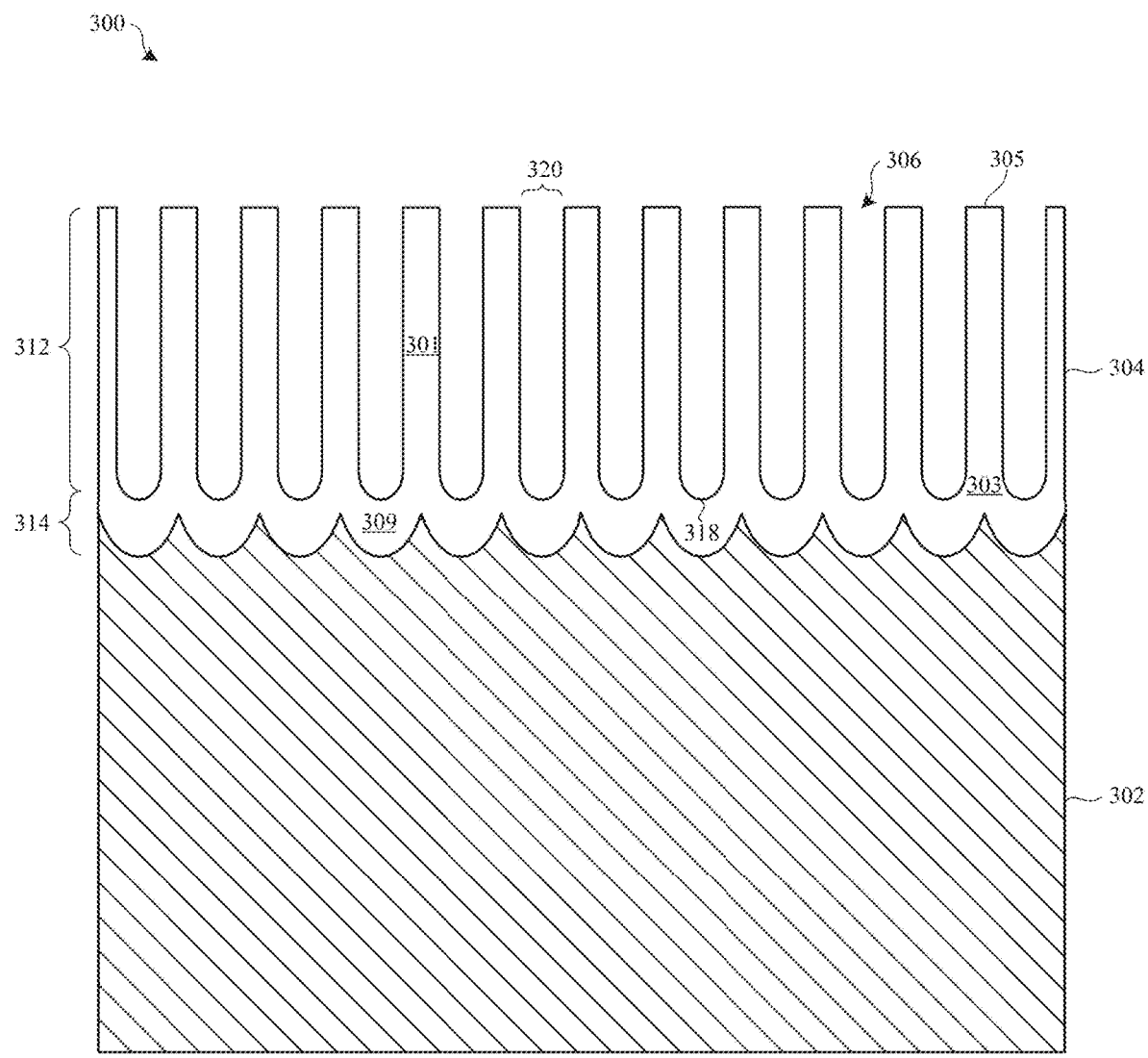
FIGS. 3A-3E show cross section views of an anodized part that having a multiple layered structure that provides a white appearance, in accordance with some embodiments.

FIG. 3A shows part 300 after metal substrate 302 is anodized using a first anodizing process. Metal substrate 302 can be any suitable anodizable material, such as suitable aluminum and aluminum alloys. In some embodiments, metal substrate 302 is a 5000 series, 6000 series or 7000 series aluminum alloy. The first anodizing process converts a portion of metal substrate 302 to first metal oxide layer 304. First metal oxide layer 304 is composed of metal oxide material 303, the composition of which depends on the composition of metal substrate 302. For example, an aluminum alloy metal substrate 302 can be converted to a corresponding aluminum oxide material 303. First metal oxide layer 304 includes porous portion 301 (defined by thickness 312) and the barrier layer 309 (defined by thickness 314). The porous portion 301 includes pores 306, which are formed during the anodizing process, and are formed within metal oxide material 303. The barrier layer 309 is generally free of pores 306 and is situated between metal substrate 302 and porous portion 301. The thickness of first metal oxide layer 304, corresponding to thicknesses 312 of the porous portion plus thickness 314 of barrier layer 309, can vary depending on the application. In some embodiments, barrier layer has a thickness 314 of about 100 nanometers or less. In some embodiments, the thickness of first metal oxide layer 304 is between about 3 micrometers and about 15 micrometers.

In some embodiments, first metal oxide layer 304 has a pore structure that provides high mechanical strength and chemical resistance to first metal oxide layer 304. This can be accomplished by adjusting process conditions of the first anodizing process. For example, anodizing in a bath including oxalic acid can result in pores 306 that are generally wider than those formed in an electrolytic bath including sulfuric acid. For example, in some embodiments using oxalic acid-based anodizing results in pores 306 having diameters 320 between about 30 nanometers and about 100 nanometers, compared to sulfuric acid-based anodizing that can result in pores 306 having diameters 320 between about 10 nanometers and about 40 nanometers.

Although pores 306 are generally wider using oxalic acid anodizing, the density of pores 306 is less compared to the density of pores 306 using sulfuric acid anodizing. That is, the density of metal oxide material 303 and the width of pore walls 305 can be generally greater when oxalic acid anodizing compared to sulfuric acid anodizing. This greater relative density of metal oxide material 303 (using oxalic acid-based anodizing) can result in metal oxide layer 304 being harder and more chemically resistant than a sulfuric acid-based oxide film, which can be useful in applications where first oxide layer 304 corresponds to an exterior surface of a consumer product (e.g., devices of FIG. 1). In some embodiments, good results were found when the electrolyte has a relatively low concentration of oxalic acid, such as about 10 g/l of oxalic acid or less—which is lower than conventional oxalic acid anodizing processes.

It should be noted that oxalic acid-based anodizing can, in some cases, cause first metal oxide layer 304 to have a yellow hue, sometimes associated with using an organic acid-based anodizing bath. Since this may serve against providing a white appearing anodic coating, it may be preferable to use a sulfuric acid-based anodizing process in some cases. However, in some embodiments, the oxalic acid-based anodizing can result in a sufficiently white an colorless anodic film. In some cases, such a yellow hue can be offset using barrier layer thickening techniques, which will be described below with reference to FIG. 3C.

Figure 3B:
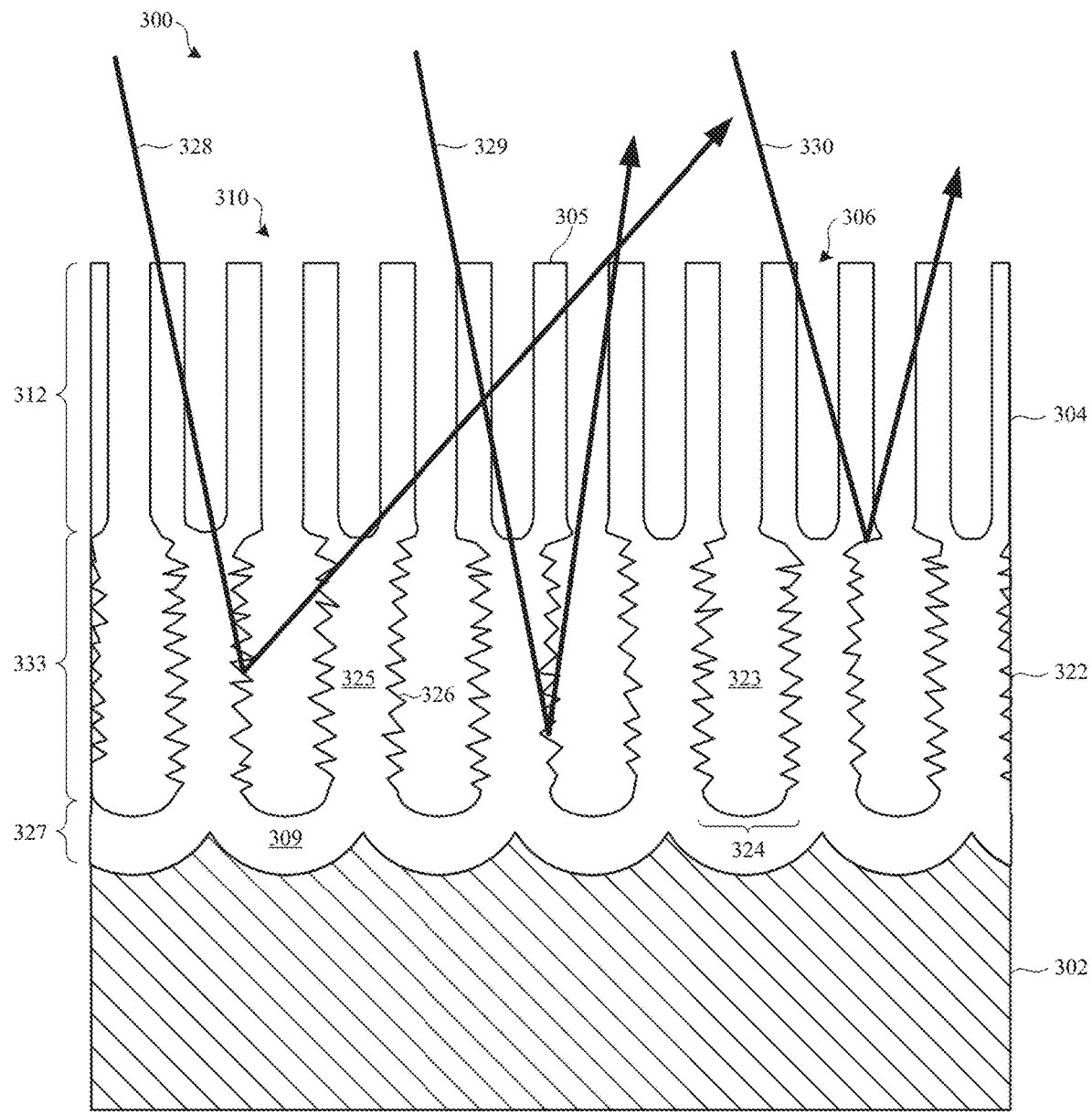

FIG. 3B shows part 300 after a second anodizing process is performed, causing more of metal substrate 302 to be converted to second metal oxide layer 322. Second metal oxide layer 322 grows beneath first metal oxide layer 304 and reforms barrier layer 309 (defined by thickness 327) adjacent metal substrate 302. Thus, the thickness of the multiple layered anodic oxide coating can be defined by thickness 312 of first metal oxide layer 304, thickness 333 of second metal oxide layer 322, and thickness 327 of barrier layer 309.

As shown, pores 323 within second metal oxide layer 322 are generally wider than pores 306 of first metal oxide layer 304. In some embodiments, the diameter 324 of pores 323 are about 100 nanometer or more, in some embodiments between about 100 nm and about 300 nm. In addition, second metal oxide layer 322 has a pore walls 325 that are irregular, in that pore walls 325 have pore wall surfaces 326 are oriented non-orthogonally with respect to the outer surface 310. This anodic pore structure can be accomplished, for example, by performing the second anodizing process in a bath including phosphoric acid.

The irregular pore structure of second metal oxide layer 322 can impart a white appearance to the anodic coating by diffusely reflecting incoming visible light. This is illustrated by first light ray 328 entering outer surface 310 of first metal oxide layer 304, reflecting off of pore wall surfaces 326 of second metal oxide layer 322, and exiting outer surface 310 at a first angle. Second light ray 329 enters outer surface 310 of first metal oxide layer 304, reflects off of pore wall surfaces 326, and exits outer surface 310 at a second angle different than the first angle. Third light ray 330 enters outer surface 310 of first metal oxide layer 304, reflects off of pore wall surfaces 326, and exits outer surface 310 at a third angle different than the first angle and the second angle. In this way, pore wall surfaces 326 within second metal oxide layer 322 can diffusely reflect visible light and impart a white appearance to the multiple layered anodic oxide coating of part 300. In some embodiments, a good whitening results were found when the second anodizing process involves using an electrolytic bath having a relatively low concentration of phosphoric acid, such as about 17 g/l of phosphoric acid or less—which is much lower than conventional phosphoric acid anodizing processes.

It should be noted that first metal oxide layer 304, which can generally have more mechanical strength and be more dense (i.e., have more volume percent of metal oxide material) than second metal oxide layer 322 can provide structural integrity to the anodic film, while underlying second metal oxide layer 322, while generally more porous than first metal oxide layer 304, can provide the porous structure suitable for providing a white appearance to the anodic film.

Figure 3C:
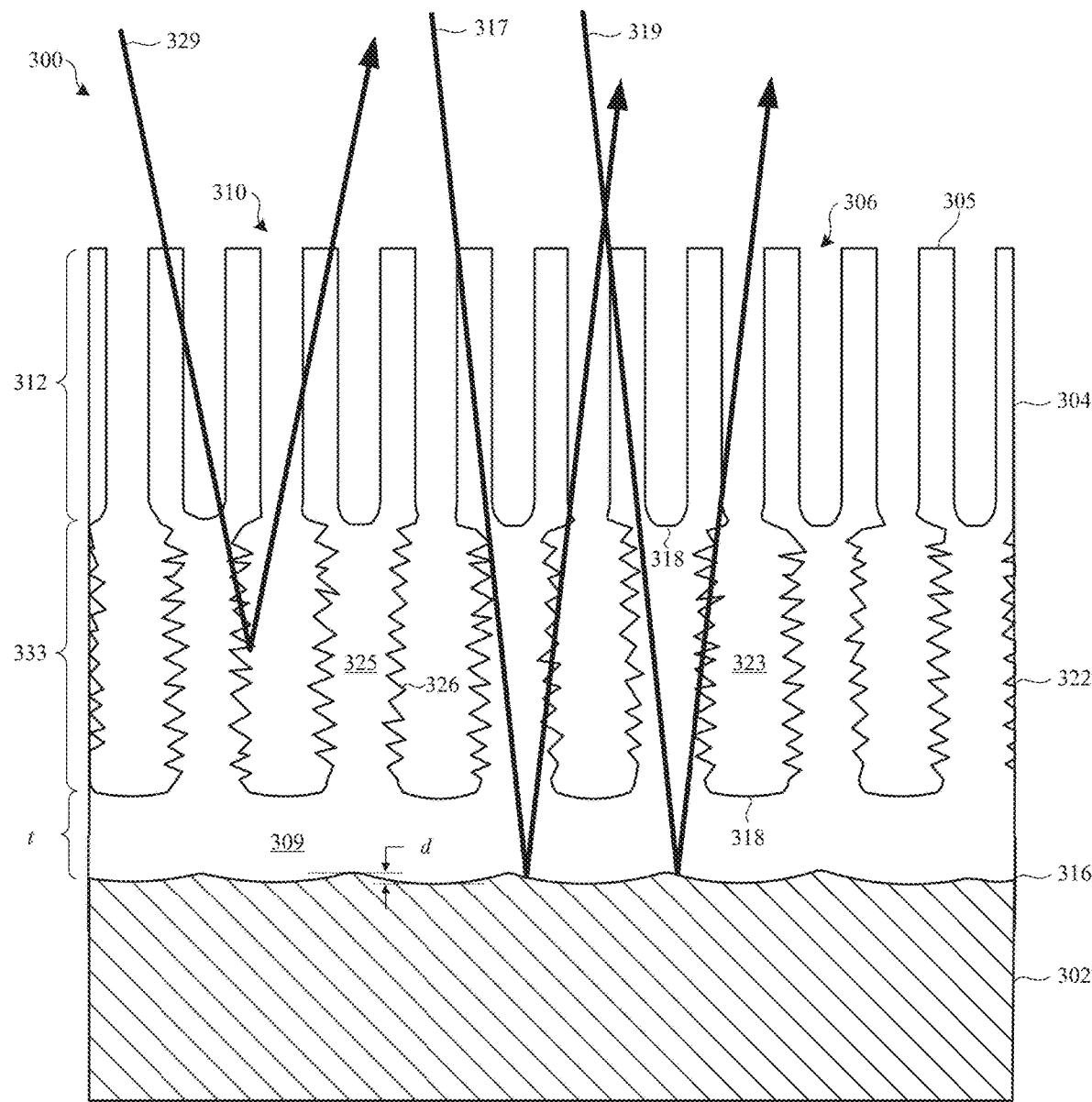

At FIG. 3C, barrier layer 309 is optionally smoothed and thickened in order to enhance the whitening of the multiple layered anodic oxide coating. The smoothing of barrier layer 309 can smooth out interface surface 316 of barrier layer 309, which previously had a scalloped geometry. This can cause incoming light that does not diffusely reflect off of pore wall surfaces 326 to specularly reflect off flat interface surface 316. For instance, light ray 317 enters outer surface 310 of first metal oxide layer 304, passes through first metal oxide layer 304 and second metal oxide layer 322, reflects off of interface surface 316, and exits outer surface 310 at a first angle. Light ray 319 enters outer surface 310 of first metal oxide layer 304, passes through first metal oxide layer 304 and second metal oxide layer 322, reflects off of interface surface 316, and exits outer surface 310 at the same first angle as light ray 317. Additionally or alternatively, the barrier layer smoothing process can flatten or smooth pore terminuses 318 of pores 323, such that flattened pore terminuses 318 can also specularly reflect incoming light. In this way, the smooth (i.e., flat) interface surface 316 and/or pore terminuses 318 can cause light that does not diffusely reflect off of pore wall surfaces 326 to specularly reflect off interface surface 316 and/or pore terminuses 318, resulting in brightening and enhancing the white appearance of the multiple layered anodic coating. That is, the specular reflectivity of flattened interface surface 316 increases the lightness of the whiteness caused by diffuse reflection off of pore walls 326 (see e.g., light ray 329) to produce a bright white appearance. In some embodiments, the barrier layer smoothing process is necessary in order to accomplish a particular level of lightness, which can be measured using, for example, L* values as defined by CIE 1976 L*a*b* color space model standards.

The barrier layer smoothing process can be accomplished by anodizing part 300 using a third anodizing process that promotes anodic film growth without substantially promoting anodic film dissolution, i.e., a non-pore-forming electrolyte. In some embodiments, the non-pore forming electrolyte contains one or more of $Na_2B_4O_5(OH)_4 \cdot 8H_2O$ (sodium borate or borax), $H_3BO_3$ (boric acid), $C_4H_6O_6$ (tartaric acid), $(NH_4)_2 \cdot 5B_2O_3 \cdot 8H_2O$ (ammonium pentaborate octahydrate), $(NH_4)_2B_4O_7 \cdot 4H_2O$ (ammonium tetraborate tetrahydrate), $C_6H_{10}O_4$ (hexanedioic acid or adipic acid), $C_6H_{16}N_2O_4$ (ammonium adipate), $(NH_4)_2C_4H_4O_6$ (ammonium tartrate), $C_6H_8O_7$ (citric acid), $C_4H_4O_4$ (maleic acid), $C_2H_4O_3$ (glycolic acid), $C_6H_4(COOH)_2$ (phthalic acid), $Na_2CO_3$ (sodium carbonate), $[Six(OH)_{4-2x}]_n$ (silicic acid), and $H_3NSO_3$ (sulfamic acid). Suitable barrier layer smoothing processes are described in detail in U.S. provisional application No. 62/249,079, filed Oct. 30, 2015, which is incorporated herein by reference in its entirety. In some embodiments, the non-pore-forming electrolyte includes borax, boric acid or adipic acid. Below are listed some example process parameters used for a barrier layer smoothing process, in accordance with some embodiments.

Example 1

| | |
|---|---|
| Electrolyte composition | Borax |
| Electrolyte temperature (degrees Celsius) | 20-25 |
| Electrolyte pH | 9.0-9.2 |
| Maximum voltage range | 400 V-460 V |

Example 2

| | |
|---|---|
| Electrolyte composition | Boric acid |
| Electrolyte temperature (degrees Celsius) | 20-25 |
| Electrolyte pH | 4.9-5 |
| Maximum voltage | 400 V |

Example 3

| | |
|---|---|
| Electrolyte composition | Adipic acid |
| Electrolyte pH | 3.0-10.0 |
| Maximum voltage range | 400 V-550 V |

Barrier layer 309 can be smoothed to differing amounts, depending on a desired final smoothing outcome and process limitations. In some embodiments, the barrier layer smoothing process is performed until interface surface 316 achieves a profile variance of no more than about 30 nanometers, where the profile variance is defined as a distance d between an adjacent peak and valley of the interface surface 316 over a predefined distance across part 300. In some embodiments, the profile variance is no more than about 6% of the thickness t of barrier layer 309. Profile variance can be measured, for example, using a scanning electron microscope (SEM) cross section image of the part 300. SEM cross section images of some samples are described below with reference to FIGS. 9A-9B, 10A-10B and 11A-11B.

In addition to smoothing barrier layer 309, the barrier layer thickening process can also thicken barrier layer 309 to thickness t. That is, thickness t is greater than thickness 314 (in FIG. 3A) prior to the barrier layer smoothing process. This aspect can be used to compensate for any discoloration of the anodic oxide coating. For example, as described above, anodizing in organic acids such as oxalic acid can cause first metal oxide layer 304 to have a yellow hue. To offset this yellowing, barrier layer 309 can be used to reflect light via thin film interference. For example, objects that reflect a yellow color will have a positive b* value and objects that reflect a blue color will have a negative b* value, according to CIE 1976 L*a*b* color space model measurements. Thus, thickness t of barrier layer can be tuned to create light interference effects that add a blue hue (negative b* value) to offset a yellow hue (positive b* value) of first barrier layer 304. Likewise, thickness t of barrier layer can be tuned to create light interference effects that add a magenta hue (positive a* value) to offset a green hue (negative a* value) of first barrier layer 304. In this way, a more color-neutral anodic coating conducive to a white appearance can be achieved. Some discussion as to use of barrier layers for thin film interference coloring are described U.S. provisional application No. 62/249,079, filed Oct. 30, 2015, and U.S. non-provisional application Ser. No. 14/312,502, each of which is incorporated herein its entirety.

Thus, the final thickness t of barrier layer 309 can be chosen so as to sufficiently smooth barrier layer 309 as well as to reflect a desired range of wavelengths of light by thin film interference. In some embodiments, thickness t of barrier layer 309 is at least about 200 nanometers. In some embodiments, thickness t is about 300 nanometers or more. In some embodiments, thickness t is about 400 nanometers or more. In some embodiments, thickness t about is between about 150 nanometers and 800 nanometers.

Figure 3D:
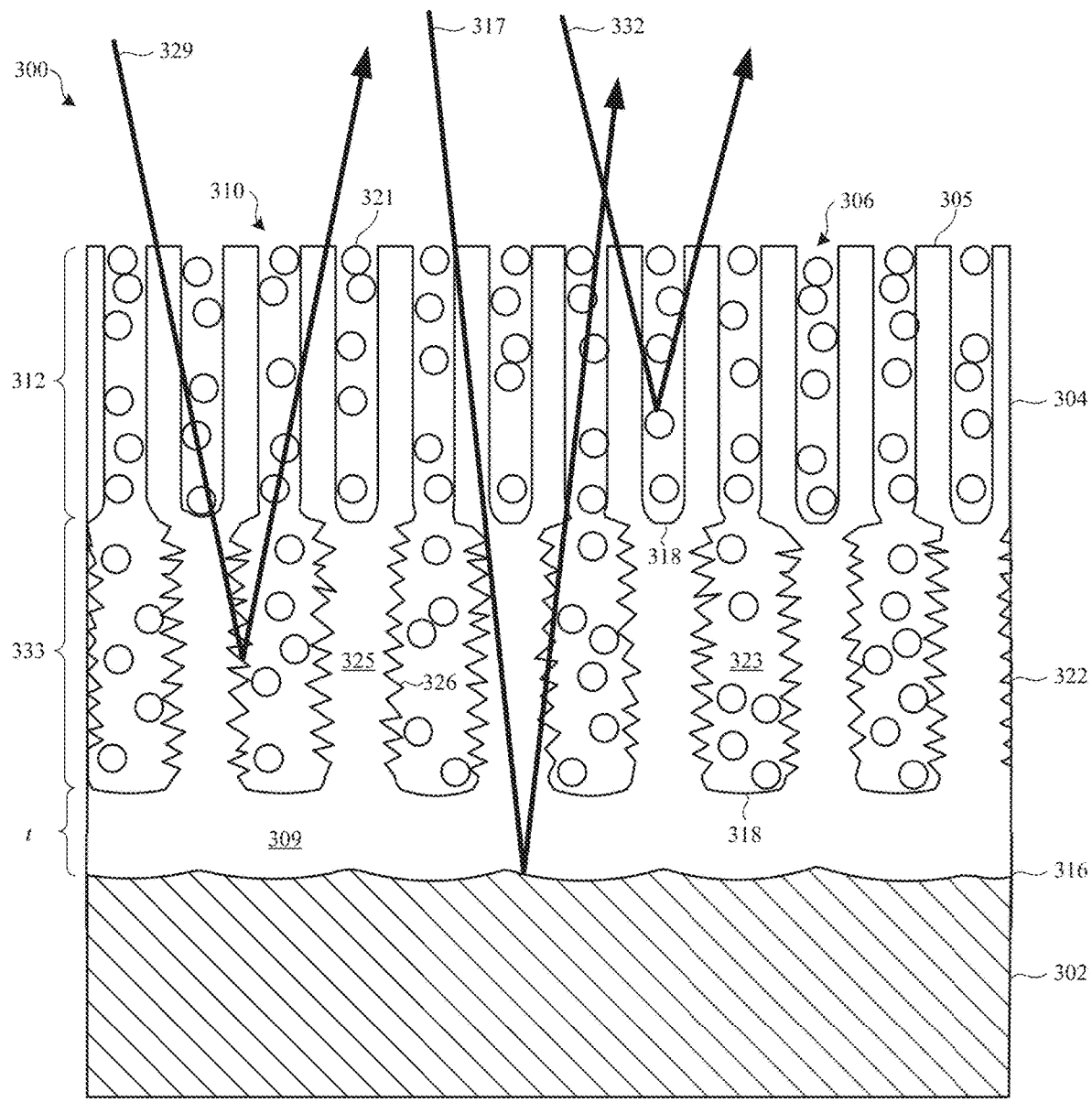

FIG. 3D shows part 300 after an optional pigment infusing process is performed, which involves depositing particles 321 within the multiple layered anodic oxide coating. Particles 321 should have a white appearance or otherwise be highly optically reflective. In some embodiments, particles 321 are composed of one or more of a titanium oxide (e.g., $TiO_2$), an aluminum oxide (e.g., $Al_2O_3$) and a zinc oxide (e.g., ZnO). Particles 321 can be infused using any suitable method. In some cases, part 300 is immersed in a solution that has particles 321 suspended therein. In some embodiments, the solution is an aqueous solution with a controlled pH conducive to promoting diffusion of particles 321 within pores 306. Particles 321 thereby become infused within pores 306 and get trapped such that, when part 300 is removed from the solution, at least some of particles 321 remain within pores 306. In some embodiments, particles 321 become infused within both second metal oxide layer 322 and first metal oxide layer 304.

Particles 321 can diffusely reflect incoming visible light (e.g., light ray 332), thereby further enhancing the whiteness of the multiple layered anodic oxide coating. Thus, incoming light can diffusely reflect off of pore walls 326 of second metal oxide layer 322 (e.g., light ray 329), diffusely reflect off of particles 321 (e.g., light ray 332), and specularly reflect off of flattened interface surface 316, resulting in a bright and white appearance. Note that the particle infusing process shown in FIG. 3D is optional. That is, in some embodiments, a white enough multiple layered anodic oxide coating is achieved without infusing particles 321. In some embodiments, however, the addition of particles 321 may be beneficial to achieving adequate levels of whiteness.

Figure 3E:
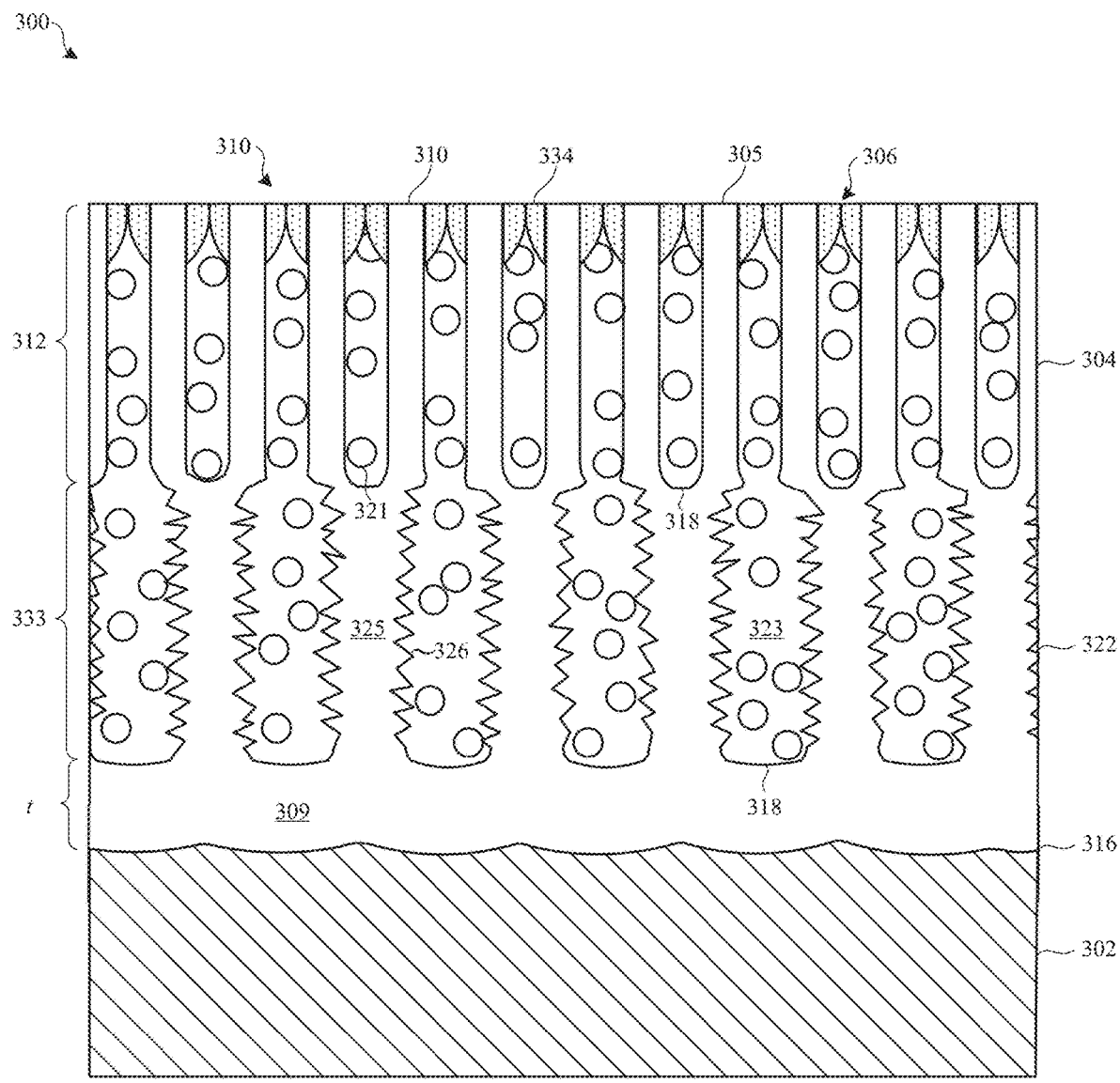

FIG. 3E shows part 300 after an optional pore sealing process is performed in order to enhance the chemical resistance and corrosion resistance of the anodic oxide coating. The sealing process can hydrate the metal oxide material 303 of at least top portions of pore walls 305 of first metal oxide layer 304. In particular, the sealing process can convert metal oxide material 303 to its hydrated form 334, thereby causing swelling of pore walls 305 and sealing of pores 306. The chemical nature of hydrated metal oxide material 334 will depend on the composition of metal oxide material 303. For example, aluminum oxide ($Al_2O_3$) can be hydrated during the sealing process to form boehmite or other hydrated forms of aluminum oxide. The amount of hydration and sealing can vary depending on the sealing process conditions. In some embodiments, only a top portion of pores 306 of first metal oxide layer 304 is hydrated, while in some embodiments substantially the entire length of pores 306 of first metal oxide layer 304 is hydrated. In some cases, a portion of pores 323 of second metal oxide layer 304 are also hydrated. Any suitable pore sealing process can be used, including exposing part 300 to hot aqueous solution or steam. In some cases additives are added to the aqueous solution, such as nickel acetate or other commercial additives, such as Okuno Chemical H298 (manufactured by Okuno Chemical Industries Co., Ltd., based in Japan).

After sealing, the multiple layered anodic coating of part 300 can have superior hardness and scratch resistance and appear an opaque white color. The sealing of pores 306 may also help retain particles 321 within the multiple layered anodic coating (in embodiments that include particles 321). In some embodiments, the multiple layered anodic coating of part 300 is characterized as having a hardness value of at least 150 HV. In some embodiments, the multiple layered anodic coating of part 300 is characterized as having an L* value of 80 or higher, a b* value between about −3 and about +6 and an a* value of between about −3 and about +3. Note that in some embodiments, the barrier layer smoothing process can be necessary to achieve a certain level of lightness, related to the whiteness, of the multiple layered metal oxide film. For example, one multiple layered metal oxide coating sample was characterized as having an L* value of 74.16, a b* value of 1.75, and an a* value of 0.05, and visually appeared grey prior to performing the barrier layer smoothing process. After the barrier layer smoothing process, the multiple layered metal oxide coating sample was characterized as having an L* value of 84.30, a b* value of 1.85, and an a* value of −0.38, and visually appeared white. Thus, the barrier layer smoothing process can be used to increase the lightness (L*) and/or reduce discoloration (b* or a*) of the multiple layered anodic film.

In some cases, the whiteness of the anodic coating can be characterized using whiteness index (WI) ratings. One equation used for the measuring WI is the CIE standard illumination D65 formulae for whiteness $W_{10}$:

$$W_{10} = Y_{10} 800(x_{n,10} - x_{10}) + 1700(y_{n,10} - y_{10})$$

where Y is the Y tristimulus value (relative luminance), (x,y) is the chromaticity coordinate in the CIE 1931 color space, $(x_n, y_n)$ is the chromaticity coordinate of the perfect diffuser (reference white), and the subscript ten (10) indicates the CIE 1964 standard observer.

In general, the higher the $W_{10}$ value, the greater the whiteness. In some embodiments, the multiple layered anodic coating of part 300 has a $W_{10}$ value of at least 75. It should be noted that in some embodiments these whiteness index values can be achieved without the use colorants (e.g., dyes, pigments or metal colorant) within the anodic oxide coating. In other embodiments, the anodic coating should include a colorant, such as pigment particles described above with reference to FIGS. 3D and 3E, in order to achieve these whiteness index values.

Thickness 312 of first metal oxide layer 304, thickness 333 of second metal oxide layer 322, and thickness t of barrier layer 309 can vary depending on desired mechanical or color properties of the multiple layered anodic coating. In particular embodiments, thickness 312 of first metal oxide layer 304 is between about 3 micrometers and about 15 micrometers, thickness 333 of second metal oxide layer 322 is between about 2 micrometers and about 15 micrometers, and thickness t of barrier layer 309 is at least about 200 nanometers (in some embodiments up to about 800 nanometers). In some embodiments, a final thickness of the multiple layered anodic coating of part 300 (including thickness 312, thickness 333 and thickness t) is between about 5 micrometers and about 30 micrometers.

It should be noted that thickness t of barrier layer 309 is dependent, in part, on the voltage used during the barrier layer smoothing process, with higher voltages associated with a thicker barrier layer 309. If the voltage used in the barrier layer smoothing process is too high, this could cause first metal oxide layer 304 and/or second metal oxide layer 322 to breakdown. Thus, the voltage should be kept sufficiently low to prevent such breakdown. This means that a maximum thickness t of barrier layer 309 is limited. In some embodiments, thickness t is grown to a maximum of about 800 nanometers. As described above, however, thickness t should be large enough to be associated with sufficient flattening of interface surface 316. This means that in some embodiments, thickness t should range between about 150 nanometers and about 800 nanometers. In some embodiments, thickness t of the barrier layer is at least about 6% of a total thickness of the anodic coating (t+333+312).

Figure 4:
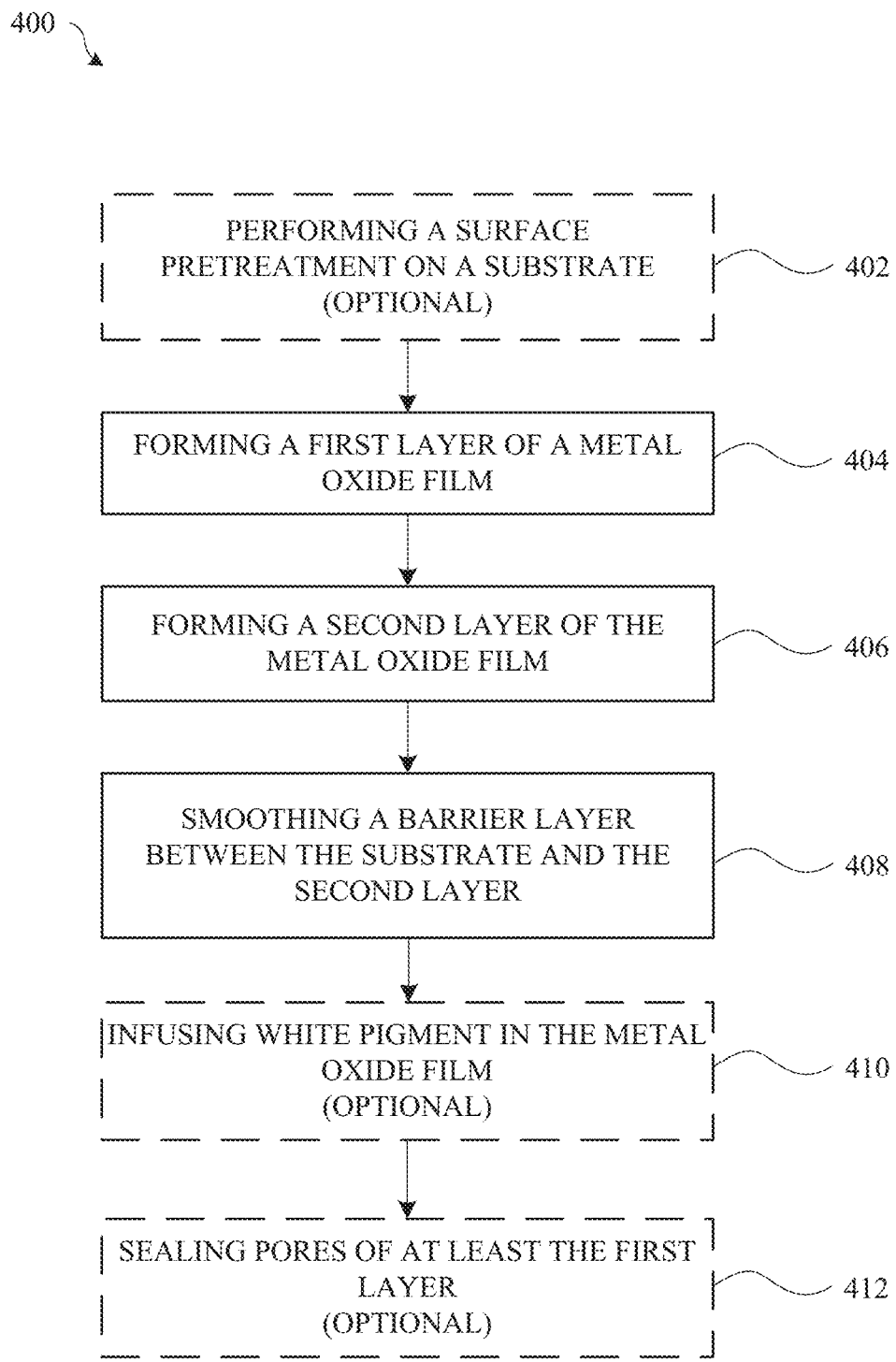
FIG. 4 shows a flowchart indicating a process for forming a multiple layered anodic film having a white appearance, in accordance with some embodiments.

FIG. 4 shows flowchart 400, which indicates a process for forming a multiple layered anodic coating having a white appearance, in accordance with some embodiments. At 402, a substrate undergoes an optional surface pretreatment. In some embodiments, the surface pretreatment involves polishing a surface of the substrate to a mirror polish reflection. In some embodiments, the substrate surface is polished until the surface achieve a gloss value of 1500 gloss units or greater, as measured at 20 degree reflection. In a particular embodiment, the gloss value is about 1650 gloss units as measured at 20 degree reflection. The level of flatness/smoothness of the substrate surface prior to anodizing can be important in some embodiments in order to help achieve a sufficiently smooth barrier layer after a barrier layer smoothing process is performed (see FIG. 3C). Other surface pretreatment processes can include degreasing and de-smutting (e.g., exposure to a nitric acid solution for 1-3 minutes). Care should be taken, however, to assure the degreasing and de-smutting do not significantly damage the mirror polished surface of the substrate. The substrate can be composed of any suitable anodizable material, such as a suitable aluminum alloy.

At 404, a first layer of a metal oxide film is formed using a first anodizing process. In some cases, the first anodizing process involves using a first electrolyte that includes oxalic acid or sulfuric acid. In some embodiments, the first electrolyte has an oxalic acid concentration of between about 5 g/l and about 60 g/l. In some embodiments, the oxalic acid concentration is about 10 g/l or less—which is lower than conventional oxalic acid anodizing. In some embodiments, the temperature of the electrolyte during anodizing is between about 20 degrees C. and about 40 degrees C., using an anodizing voltage of between about 40 volts and about 100 volts, using an anodizing current density of between about 1 A/dm$^2$ and about 4 A/dm$^2$. The anodizing time period will vary depending on a desired thickness of the first metal oxide layer. In some embodiments, the first anodizing time period is between about 1 minute and 5 minutes.

At 406, a second layer of the metal oxide film is formed using a second anodizing process. The second layer can be structurally different than the first layer in that the second layer can have more pore wall surfaces that diffusely reflect visible light incident an exterior surface of the metal oxide film compared to the first layer. For example, the first layer of the metal oxide film can have pore walls that are substantially orthogonal to the exterior surface of the anodic coating, whereas pore wall surfaces of the second layer of the metal oxide film can be oriented non-orthogonally with respect to the exterior surface such that light can reflect off the pore wall surfaces (see FIGS. 3A-3D).

In some embodiments, the second electrolyte includes phosphoric acid in a concentration of between about 15 g/l and about 250 g/l. In some embodiments, the phosphoric acid concentration is about 17 g/l or less—which is lower than conventional phosphoric acid anodizing. In some embodiments, the temperature of the second electrolyte during anodizing is between about 5 degrees C. and about 70 degrees C., using an anodizing voltage of between about 70 volts and about 150 volts, using an anodizing current density of between about 0.5 A/dm$^2$ and about 5 A/dm$^2$. In some embodiments, the electrolyte temperature is maintained at about 60 degrees C. or higher during the anodizing, which is higher than conventional voltages used in phosphoric acid anodizing. The anodizing time period will vary depending on a desired thickness of the second metal oxide layer. In some embodiments, the second anodizing time period is between about 25 minute and 50 minutes.

At 408, the barrier layer of the multiple layered metal oxide film is smoothed using a third anodizing process, which can be referred to as a barrier layer smoothing process. The third anodizing process can be performed in a non-pore forming electrolyte such that the additional metal oxide material is non-porous, effectively thickening the substantially non-porous barrier layer. In some embodiments, the non-pore forming electrolyte contains one or more of $Na_2B_4O_5(OH)_4.8H_2O$ (sodium borate or borax), $H_3BO_3$ (boric acid), $C_4H_6O_6$ (tartaric acid), $(NH_4)_2.5B_2O_3.8H_2O$ (Ammonium pentaborate octahydrate), $(NH_4)_2B_4O_7.4H_2O$ (ammonium tetraborate tetrahydrate), $C_6H_{10}O_4$ (hexanedioic acid), $C_6H_{16}N_2O_4$ (ammonium adipate), $(NH_4)_2C_4H_4O_6$ (ammonium tartrate), $C_6H_8O_7$ (citric acid), $C_4H_4O_4$ (maleic acid), $C_2H_4O_3$ (glycolic acid), $C_6H_4(COOH)_2$ (phthalic acid), $Na_2CO_3$ (sodium carbonate), $[Six(OH)_{4-2x}]_n$ (silicic acid), and $H_3NSO_3$ (sulfamic acid).

In particular embodiments, the third anodizing process involves anodizing in an electrolyte having borax in a concentration of between about 10 g/l and 20 g/l (at a pH between about 9 and 9.2) held at an anodizing temperature of between about 20 degrees C. and 30 degrees C. In another embodiment, an electrolyte having boric acid in a concentration of between about 10 g/l and 20 g/l (at a pH of about 6) held at an anodizing temperature of between about 20 degrees C. and 30 degrees C. was used. The voltage of the anodizing process can vary depending, in part, on a desired interference coloring provided by the barrier layer. In some embodiments, a voltage of between about 200 volts and about 550 volts, with low current density, is used. In a particular embodiment, a DC voltage is applied and increased at a rate of about 1 volt/second until a voltage of between about 300 volts and about 500 volts is achieved, which is maintained for about 5 minutes.

At 410, a white pigment is optionally infused within the metal oxide film. Any suitable white coloring agent can be used. In some embodiments, the white pigment includes particles composed of a titanium oxide (e.g., $TiO_2$), an aluminum oxide (e.g., $Al_2O_3$), a zinc oxide (e.g., ZnO), or any suitable combination thereof. In some embodiments, the white pigment is infused by exposing the metal oxide film to an aqueous solution having white pigment particles suspended therein such that the pigment particles deposit into and get trapped within the anodic pores of at least the second layer.

At 412, the multiple layered metal oxide film is optionally sealed to seal at least top portions of the pores of the first layer. This can increase the mechanical strength and corrosion resistance of the multiple layered metal oxide film. In some embodiments, a target hardness of the multiple layered metal oxide film is at least about 150 HV, suitable for use in housing for electronic devices. In addition, the sealing process can retain the white pigment particles (if used) within the anodic pores of the metal oxide film.

Figure 5A:
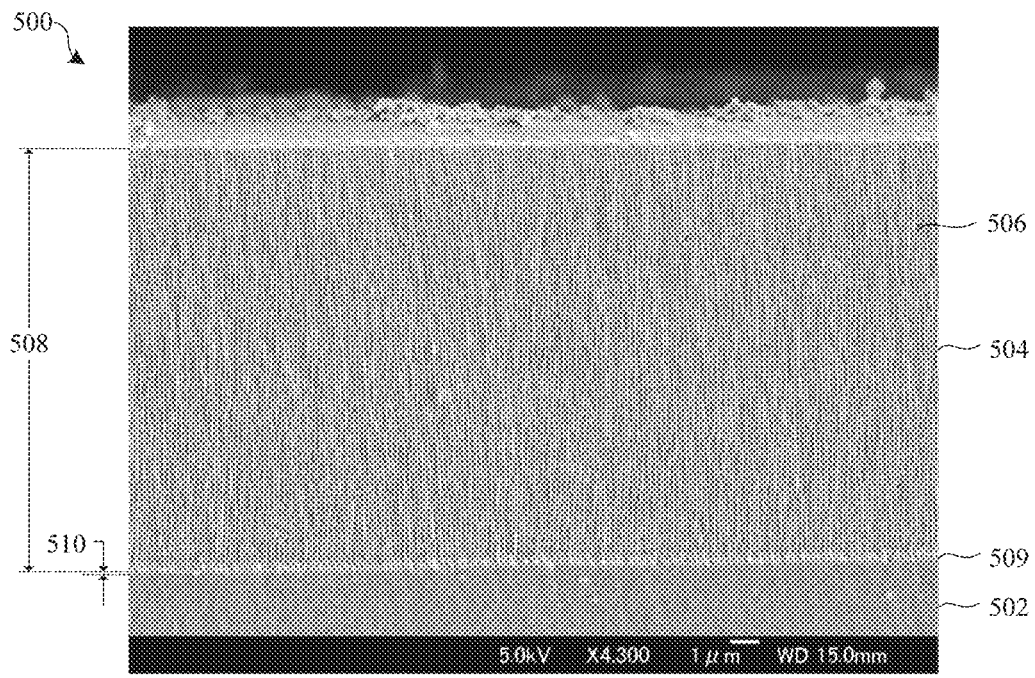
FIGS. 5A-5C show SEM cross section images of different parts at various stages of forming a multiple layered anodic oxide coating, in accordance with some embodiments.
Figure 5B:
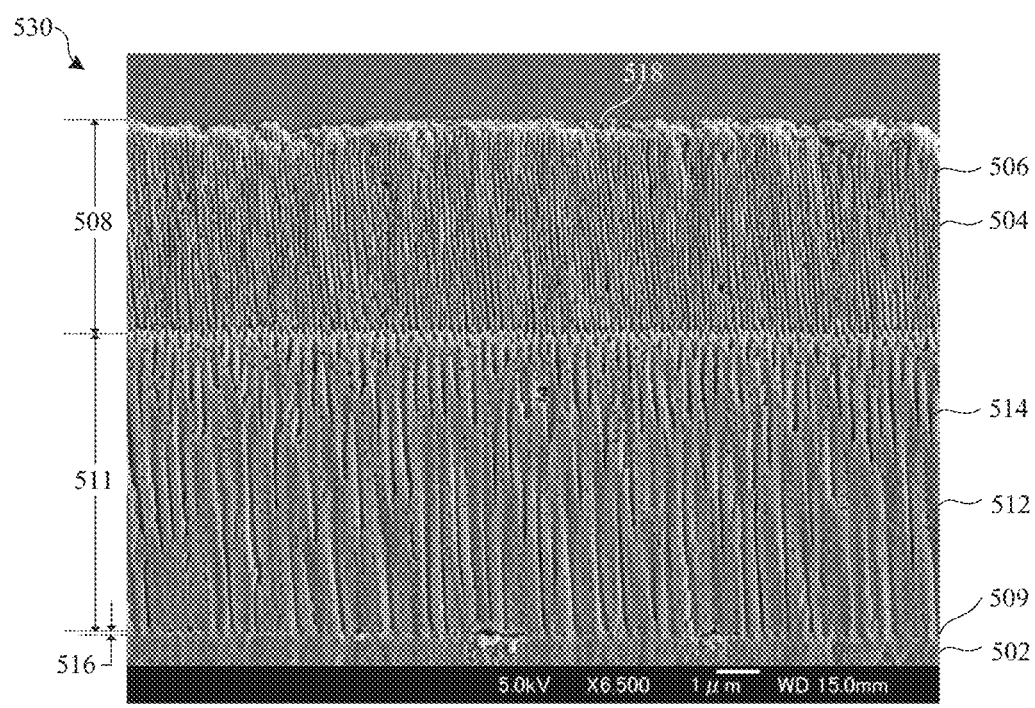
Figure 5C:
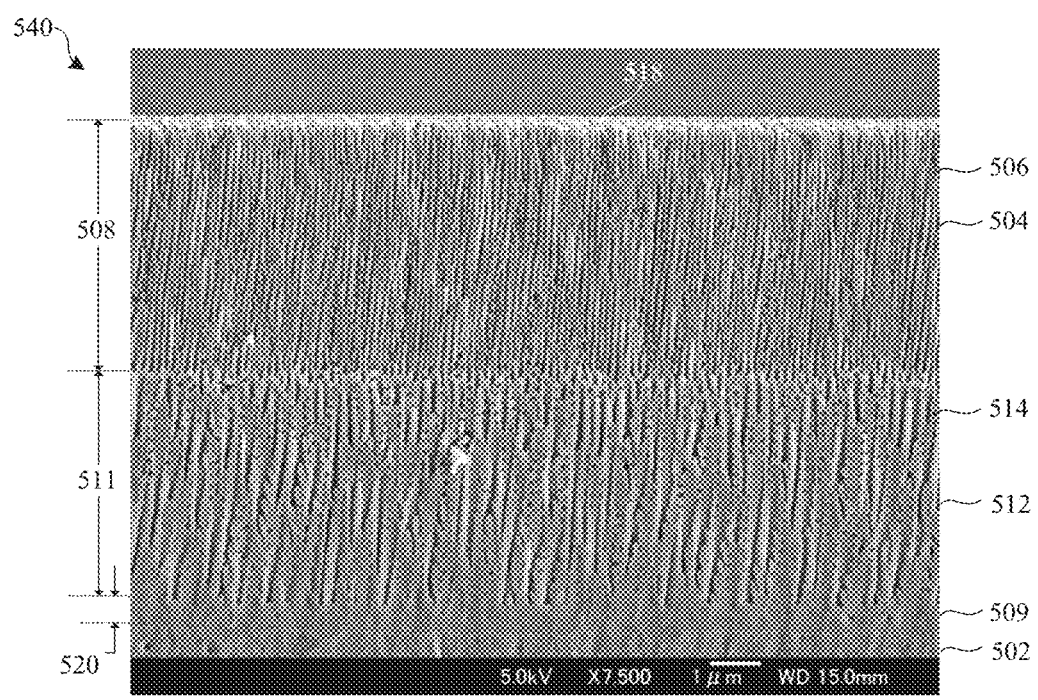

FIGS. 5A-5C show SEM cross section images of different parts at various stages of forming a multiple layered anodic oxide coating, in accordance with some embodiments. FIG. 5A shows part 500 after a first anodizing process converts a portion of substrate 502 to first metal oxide layer 504. Substrate 502 is composed of an aluminum alloy and the anodizing process involved using a sulfuric acid-based bath. The resulting first metal oxide layer 504 has pores 506 and barrier layer 509. Pores 506 have diameters of about 40 nm to about 50 nm. First oxide layer 504 has a thickness 508 of about 14.5 micrometers and barrier layer 509 has a thickness 510 between about 50 nm and about 70 nm.

FIG. 5B shows part 530 after two anodizing processes have been performed. Like part 500, a first anodizing process using a sulfuric acid-based electrolyte is used to form first metal oxide layer 504, which as a thickness 508 of about 4.7 micrometers. In addition, a second anodizing process is performed, whereby another portion of substrate 502 is converted to second metal oxide layer 512. The second anodizing process involved using a phosphoric acid-based bath and has a thickness 511 of about 6.7 micrometers. Barrier layer 509 is grown to a thickness 516 of about 150 nm.

As shown, pores 514 within second metal oxide layer 512 are generally wider than pores 506 of first metal oxide layer 504. In particular, the diameters of pores 514 are about 100 nanometers or more, compared to pores 506 having diameters between about 40 nm and about 50 nm. Likewise, the pore walls between pores 514 of second metal oxide layer 512 are generally wider (thicker) than the pore walls between pores 506 of first metal oxide layer 504. In addition, second metal oxide layer 512 has irregular pore walls with surfaces that are oriented non-orthogonally with respect to the outer surface 518.

FIG. 5C shows part 540 after three anodizing processes have been performed. Like parts 500 and 530, a first anodizing process using an sulfuric acid-based electrolyte is used to form first metal oxide layer 504 (in this case having a thickness 508 of about 5.1 micrometers) and a second anodizing process using an phosphoric acid-based electrolyte is used to form second metal oxide layer 512 (in this case having a thickness 508 of about 4.5 micrometers). In addition, a barrier layer smoothing and thickening anodizing process is performed, where barrier layer 509 is smoothed and thickened to thickness 520 of about 550 nm. The barrier layer process involved exposing part 540 to a non-pore-forming anodizing process using a non-dissolution electrolyte (e.g., borax, boric acid, etc.) The resulting multilayered anodic coating (first oxide layer 504+second oxide layer 512+smoothed barrier layer 509) has a white appearance as viewed from outer surface 518.

FIGS. 6A-6D and 7A-7D show SEM cross section and top view images of a part indicating how a barrier layer smoothing process can affect a structure of and anodic film, in accordance with some embodiments. The part includes an anodic film 602, formed using a phosphoric acid-based anodizing process, and barrier layer 604. FIGS. 6A-6D show images of the part before a barrier layer smoothing and thickening process, and FIGS. 7A-7D show images of the part after a barrier layer smoothing and thickening process is performed. The barrier layer was smoothed using borax-based barrier layer smoothing process.

Figure 6D:
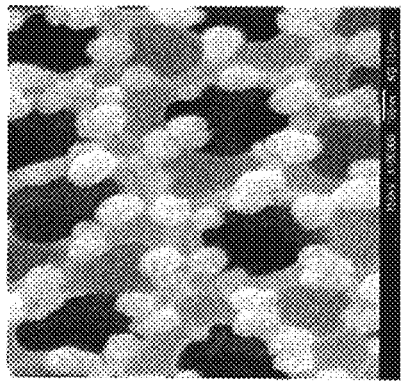
FIGS. 6A-6D and 7A-7D show SEM cross section and top view images of a part indicating how a barrier layer smoothing process can affect a structure of and anodic film, in accordance with some embodiments.
Figure 6C:
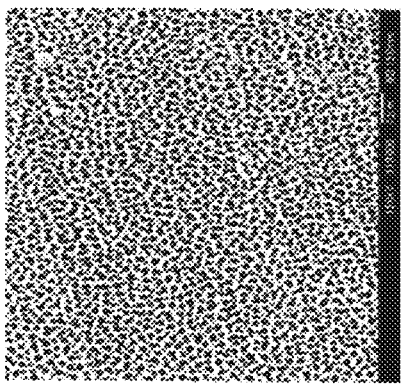
Figure 6B:
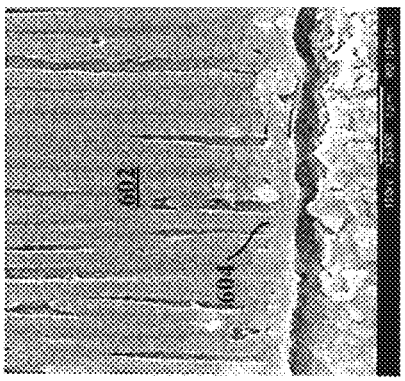
Figure 6A:
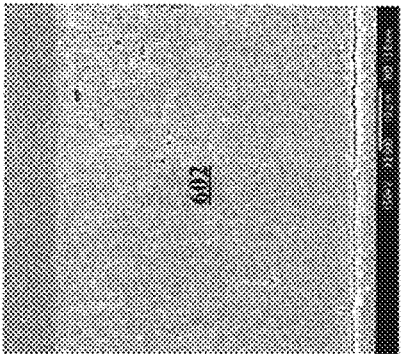
Figure 7D:
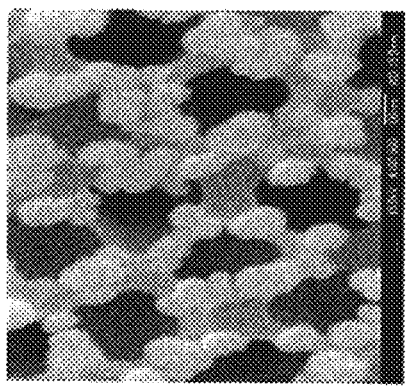
Figure 7C:
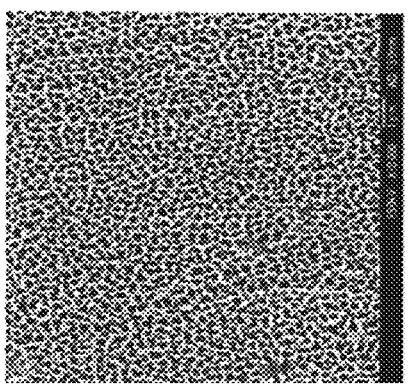
Figure 7B:
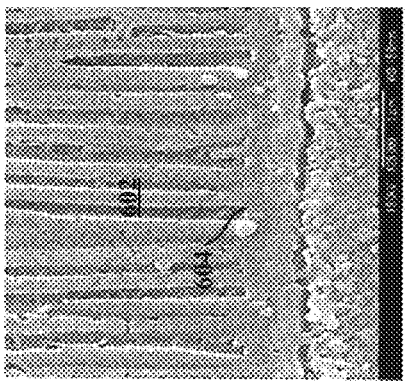
Figure 7A:
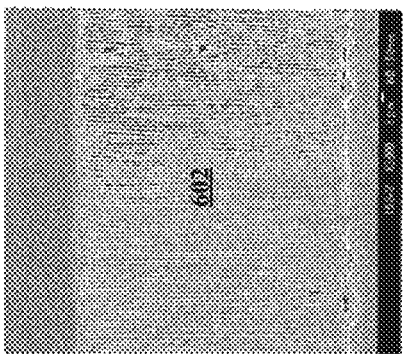

FIGS. 6A and 6B show cross section images of the part at different magnifications, with FIG. 6B at a higher magnification. As shown in FIG. 6B, barrier layer 604 prior to the barrier layer smoothing process has an uneven and inconsistent boundary. FIG. 7B shows that barrier layer 604, after the barrier layer smoothing process is performed, has a much more even boundary that is more conducive to producing a white appearance. The barrier layer smoothing process also involves thickening barrier layer 604 (i.e., from about 200 nm thick to about 800 nm thick). Whiteness measurements of the part prior to the barrier layer smoothing process is characterized as having a whiteness value $W_{10}$ of 64.7, and after the barrier layer smoothing process having whiteness value $W_{10}$ of 70.48. This data indicates that the barrier layer smoothing process can significantly increase the whiteness of an anodic film.

FIGS. 6C and 6D show top views of the anodic film at different magnifications, with FIG. 6C at a higher magnification. FIGS. 7C and 7D show top views of the anodic film after the barrier layer smoothing process. As shown, the barrier layer smoothing process did not significantly change the pore structure of anodic film 602. In particular, the pore diameters were between about 200 nm and about 260 nm before and after the barrier layer smoothing process. This data indicates that the integrity of anodic film 602 is not significantly affected by the barrier layer smoothing and thickening process.

It can be difficult to determine a level of whiteness of a part based on L*a*b* color space values alone since bright metallic surfaces can have similar L*a*b* measurements as white surfaces. FIGS. 8A-8D show how a circularly polarizing filter can be used to determine whiteness of a part, including parts having multiple layered anodic films, in accordance with some embodiments.

Figure 8A:
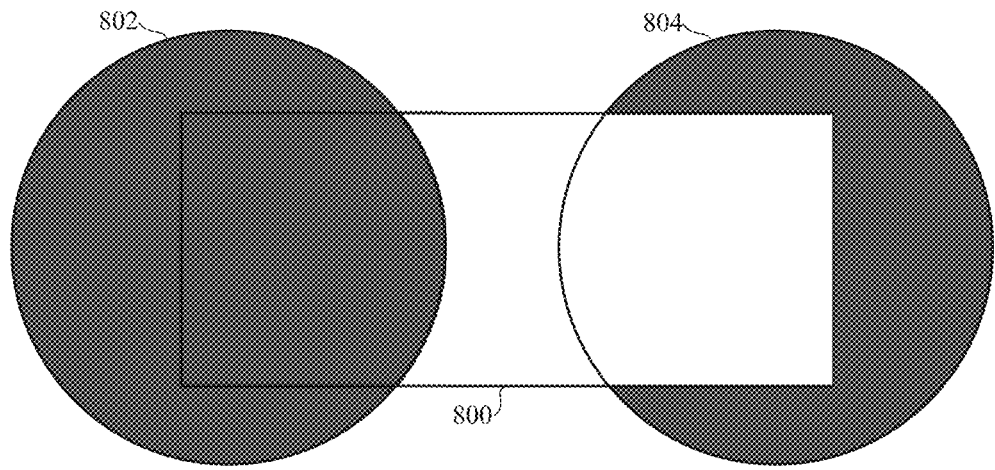
FIGS. 8A-8D show how a circularly polarizing filter can be used to determine whiteness of a part, including parts having multiple layered anodic films in accordance with some embodiments.

FIG. 8A shows a top view of part 800, which is composed of an aluminum alloy substrate and which is anodized using a type II anodizing process. The type II anodizing process results in providing an anodic coating that is relatively transparent such that the silver metal appearance of the aluminum alloy substrate is highly visible through the anodic coating. First filter 802 and second filter 804, which are both circularly polarized filters of the same type, are positioned on top of part 800. First filter 802 has a first orientation (e.g., left circularly polarized) with respect to part 800, and second filter 804 has a second orientation (e.g., right circularly polarized) with respect to part 800. First filter 802 is oriented such that the bright silver appearance of part 800 is minimized barely visible through first filter 802 (i.e., has a dark appearance). Second filter 804 is oriented such that the bright silver appearance of part 800 is maximized and clearly visible through second filter 804. L* measurements, which correspond to an amount of lightness, are taken of part 800 through first filter 802 and second filter 804. The difference between the L* values are then quantified as ΔL* (L/R), where L corresponds to left circularly polarized and R corresponds to right circularly polarized. This ΔL* (L/R) can be used to distinguish between a white surface and a light reflection off of a metallic surface (e.g., a silver colored metal surface of an aluminum alloy).

To illustrate, Table 1 below summarizes some color space value measurements for part 800 and Table 2 summarizes the same color space value measurements for a white piece of paper.

TABLE 1

| Type II anodized aluminum alloy | |
|---|---|
| $W_{10}$ | 73 |
| L* | 92 |
| a* | 0.6 |
| b* | 1.8 |
| ΔL* (L/R) | 34.3 |

TABLE 2

| White paper | |
|---|---|
| $W_{10}$ | 81.0 |
| L* | 92.8 |
| a* | 0.2 |
| b* | 0.3 |
| ΔL* (L/R) | 1.1 |

$W_{10}$ corresponds to a CIE standard illumination based on tristimulus value Y and chromaticity coordinate (x,y), as described above. In accordance with CIE D65 color space standards, L* corresponds to an amount of lightness, a* represents an amount of green or red/magenta, and b* represents an amounts of blue or yellow. Negative a* values indicate a green color while positive a* values indicate a red or magenta color. Negative b* values indicate a blue color and positive b* values indicate a yellow color. ΔL* corresponds to an amount of change of L* of the first filter compared to the second filter. $W_{10}$, L*, a* and b* measurements are taken directly at the surfaces of the anodized part 800 and white piece of paper. The ΔL* value is based on measurements are taken through first filter 802 and second filter 804.

Tables 1 and 2 indicate that the type II anodized aluminum substrate has similar $W_{10}$, L*, a* and b* values as the white piece of paper. In fact, the $W_{10}$ value, which is an indicator of whiteness, for the visibly silver anodized part 800 is greater than the $W_{10}$ value of the white piece of paper. This is because the anodized part 800 has a high specular reflectance (i.e., high shine), which is associated with high lightness measurements. Thus, although $W_{10}$, L*, a* and b* values can be an indication of how colorless and bright a part is, these values may not fully indicate a level of whiteness of a part. In contrast, the ΔL* for the anodized part 800 is much higher than that of the white piece of paper. In particular, the ΔL* value for the white piece of paper is relatively low (i.e., 1.1), whereas the ΔL* value of the bright silver anodized part 800 is much higher (i.e., 34.3). That is, a small ΔL* value is associated with a white color.

Figure 8B:
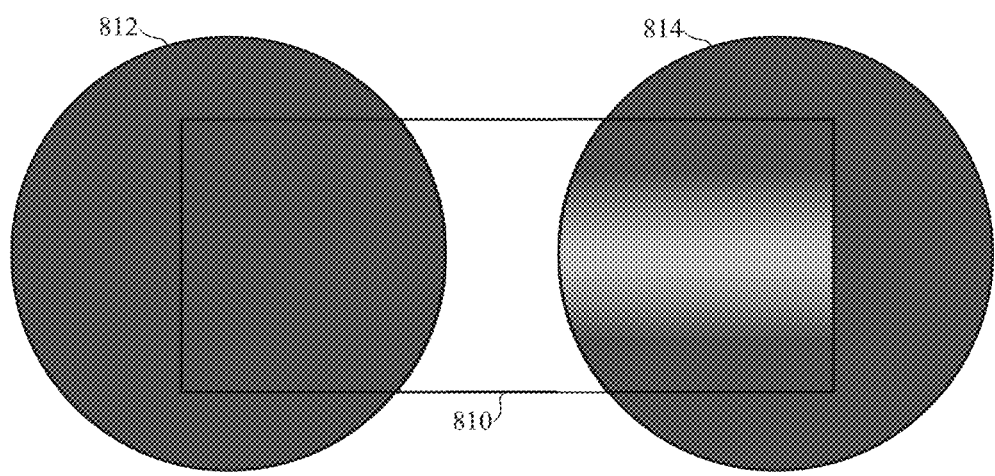

FIG. 8B shows a top view of part 810, which is composed of an aluminum alloy substrate (same type of aluminum alloy as the substrate of part 800) having been treated with multiple anodizing processes to form a white multilayered anodic film. In particular, part 810 includes a first layer formed by anodizing the substrate in an oxalic acid bath, a second layer formed by anodizing the substrate in a phosphoric acid bath, and a barrier layer that was smoothed and thickened using a barrier layer smoothing process. Circularly polarized filters 812 and 814 are positioned on top of part 810 at opposing orientations, as described above. Table 3 below summarized whiteness measurements of part 810.

TABLE 3

| Multilayered anodic film on aluminum alloy | |
|---|---|
| $W_{10}$ | 84.2 |
| L* | 90.8 |
| a* | 2.5 |
| b* | 1.3 |
| ΔL* (L/R) | 8.9 |

Table 3 indicates that part 810 has a higher $W_{10}$ value than the silver appearing type II anodized part 800. In addition, part 810 is characterized has having a much lower ΔL* value than the ΔL* value of part 810. That is, part 810 measures less change in an amount of lightness L*, as measured through opposite-oriented polarized filters, compared to part 800. This indicates that less of the lightness L* of part 810 is due to the specularly reflective underlying aluminum alloy substrate than the lightness L* of part 800. In fact, to a human eye, part 800 has a silver appearance while part 810 has a distinctively white appearance.

Figure 8C:
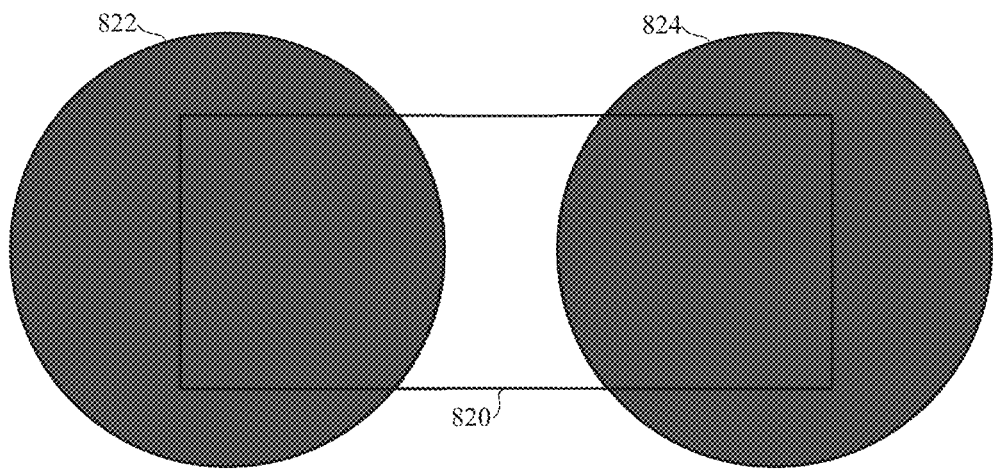

FIG. 8C shows a top view of part 820, which is composed of an aluminum alloy substrate (same type of aluminum alloy as the substrate of parts 800 and 810) having been treated with a different multiple anodizing processes than part 810. In particular, part 820 includes a first layer formed by anodizing the substrate in an oxalic acid bath, a second layer formed by anodizing the substrate in a phosphoric acid bath, a barrier layer that was smoothed and thickened using a barrier layer smoothing process, and white pigment (i.e., $TiO_2$). Circularly polarized filters 822 and 824 are positioned on top of part 820 at opposing orientations, as described above. Table 4 below summarized whiteness measurements of part 820.

TABLE 4

| Multilayered anodic film with pigment on aluminum alloy | |
|---|---|
| $W_{10}$ | 83.5 |
| L* | 88.9 |
| a* | 1.4 |
| b* | 2.0 |
| ΔL* (L/R) | 4.2 |

Table 4 indicates that part 820, like part 810, has a higher $W_{10}$ value and much lower ΔL* value than the silver appearing type II anodized part 800. Part 820 also appears to a human eye to have a distinctively white appearance. In this embodiment, the addition of $TiO_2$ pigment to the multilayered anodic film is shown to increase the $W_{10}$ value and decrease the ΔL* value compared to part 810 having a multilayered anodic film without pigment.

Figure 8D:
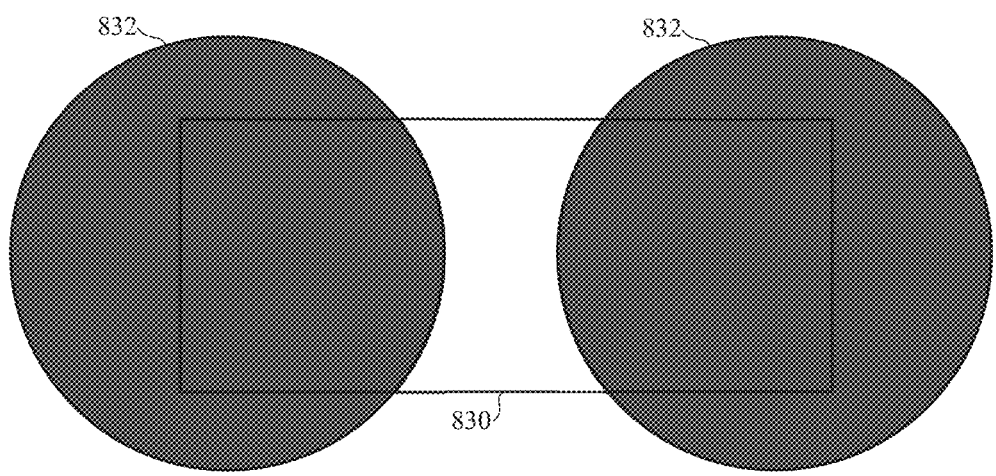

FIG. 8D shows a top view of part 830, which is composed of an aluminum alloy substrate (same type of aluminum alloy as the substrate of parts 800, 810 and 820) having been treated with a similar multiple anodizing processes as part 820. In particular, part 830 includes a first layer formed by anodizing the substrate in a sulfuric acid bath, a second layer formed by anodizing the substrate in a phosphoric acid bath, a barrier layer that was smoothed and thickened using a barrier layer smoothing process, and $TiO_2$ pigment. Circularly polarized filters 832 and 834 are positioned on top of part 830 at opposing orientations, as described above. Table 5 below summarized whiteness measurements of part 830.

TABLE 5

Multilayered anodic film with pigment on aluminum alloy

| | |
|---|---|
| $W_{10}$ | 75 |
| L* | 83 |
| a* | 1.0 |
| b* | 1.0 |
| ΔL* (L/R) | 3.6 |

Table 5 indicates that part 830, like parts 810 and 820, has much lower ΔL* value than the silver appearing type II anodized part 800. Part 830 also has an even lower ΔL* value than that of part 820, which also has a multilayered anodic film with $TiO_2$ pigment. It is noted that part 830 has a lower $W_{10}$ value than parts 810 and 820 that also have multilayered anodic films, even though part 830 appears to have a distinctively white appearance. This indicates that, in some embodiments, ΔL* values may be as important than $W_{10}$ values in determining a whiteness of an anodic film. In any cases, the parts having the multilayered anodic films (parts 810, 820 and 830) each have a higher $W_{10}$ value than that of a single layered anodic film (part 800).

The data of Tables 1-5 and FIGS. 8A-8D indicate that, in some embodiments, multilayered anodic films formed using the methods described herein can be characterized as having L* values of at least 80, a b* value between about −3 and about +6, and an a* value of between about −3 and about +3. In some embodiments, the multilayered anodic films are characterized as having $W_{10}$ values of at least about 70 and a ΔL* value of no greater than about 10. It should be noted that L*, b*, a*, $W_{10}$, ΔL* values can vary while still appearing white (e.g., not silver) to a human eye, and that process parameters and can used to adjust different structural properties of a multilayered anodic film in order to achieve a particular white appearance and hardness value. For example, the thicknesses of the first and second anodic film layers can be adjusted, as can the smoothness and thickness of the barrier layer and the amount and type of pigment used (if a pigment is used).

FIGS. 9A-9B, 10A-10B and 11A-11B show SEM images of anodic film prior to and after barrier layer smoothing processes to illustrate the extent that a barrier layer smoothing process can smooth an interface surface of a barrier layer, in accordance with some embodiments.

Figure 9A:
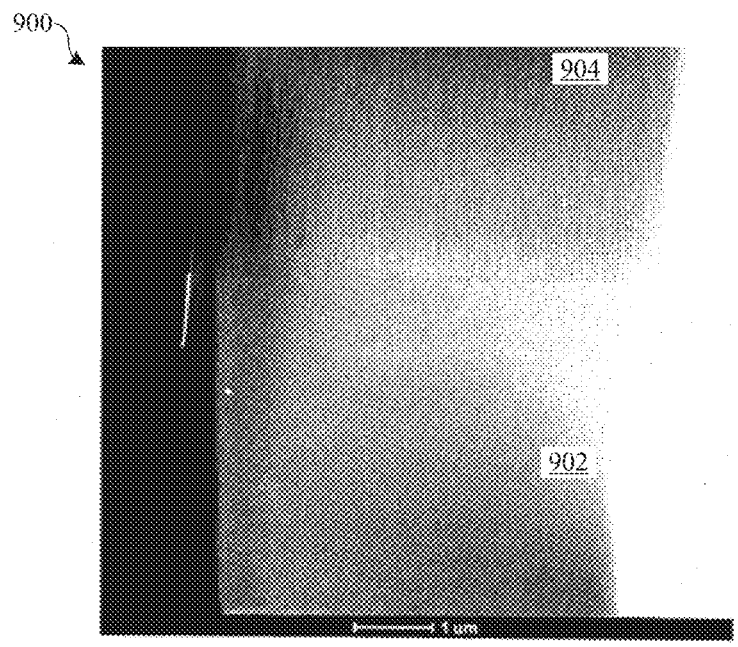
FIGS. 9A-9B, 10A-10B and 11A-11B show SEM images of anodic film prior to and after barrier layer smoothing processes to illustrate the extent that a barrier layer smoothing process can smooth an interface surface of a barrier layer, in accordance with some embodiments.
Figure 9B:
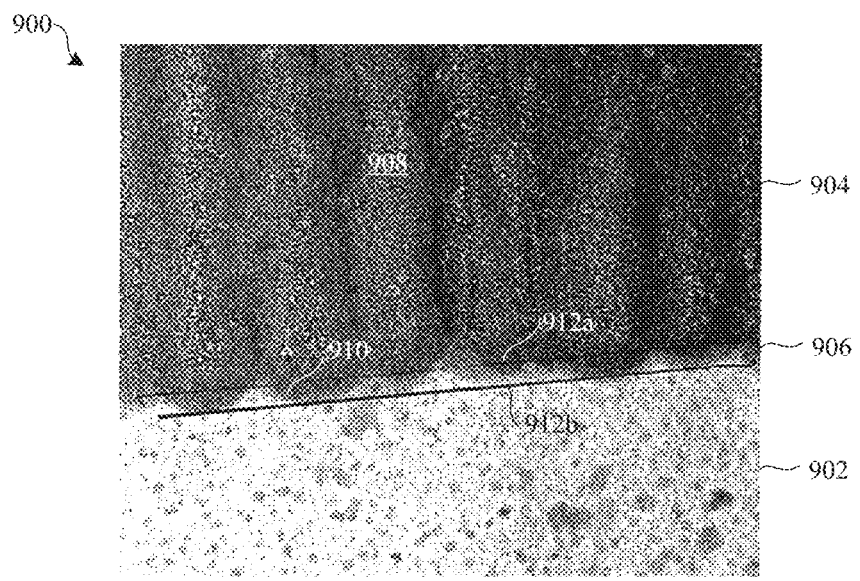

FIGS. 9A-9B show SEM cross section images of part 900 prior to a barrier layer smoothing process, with FIG. 9B showing a higher magnification. Part 900 includes substrate 902, which is composed of an aluminum alloy, and anodic film 904, which was formed using a sulfuric acid-based anodizing process (using a voltage of around 20 V) and which as pores 906. Barrier layer 906 defines interface surface 908 between barrier layer 906 and anodic film 904. As shown, interface surface 910 has a scalloped structure in accordance with the terminuses (bottoms) of pores 908. Lines 912a and 912b demarcate the depth of the pore terminuses, which can be defined as thickness measurement of the curved bottom portions of pores 908. The depth of pore 908 terminuses is found to be around 12 nm.

It should be noted that the chemistry of electrolytic bath and the voltage used during the anodizing process for forming anodic film 904 also has a relationship with the depth of pores 908. For example, sulfuric acid-based anodizing generally results in pores that are smaller in diameter than pores formed form a phosphoric acid-based anodizing process. Also, higher voltages generally result in a less smooth interface surface. For example, a phosphoric acid-based anodizing process generally results in pores that are larger in diameter and that results in a barrier layer having less smooth interface than that of a sulfuric acid-based anodizing process (see FIGS. 11A and 11B).

Figure 10A:
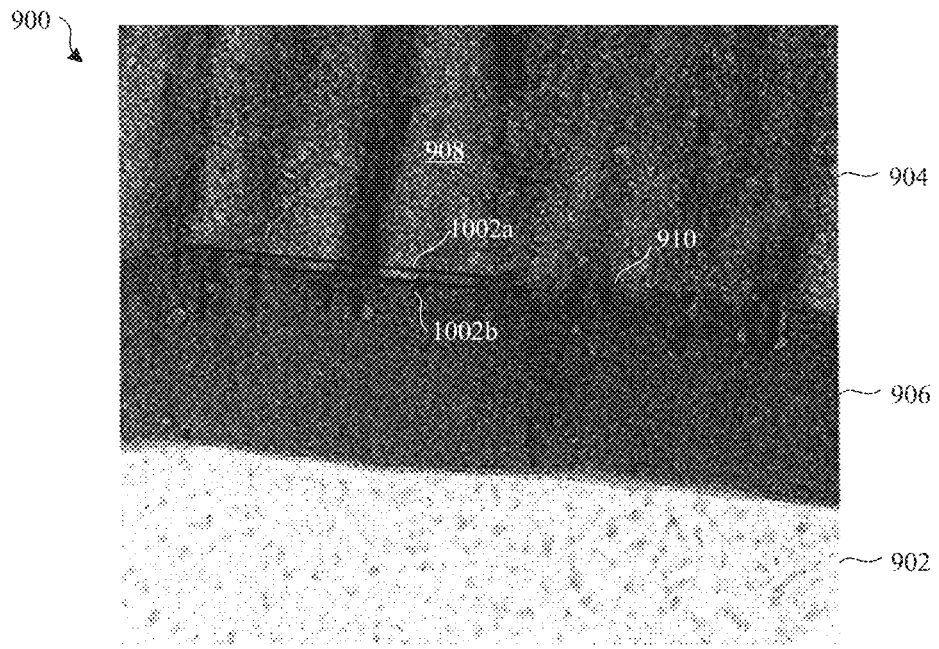
Figure 10B:
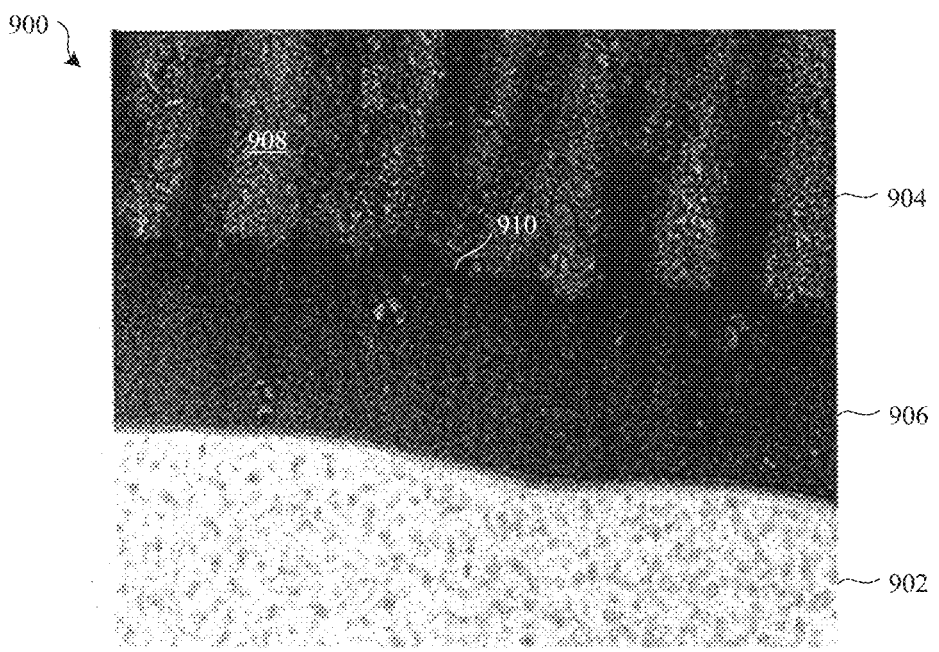

FIGS. 10A and 10B show SEM cross section images of part 900 after a barrier layer smoothing process. The barrier layer smoothing process involved applying a voltage of about 70 V to part 90 while immersed in a borax-base electrolyte. As shown, interface surface 910 is significantly smoothed and no longer has a scalloped structure. That is, the terminuses of pores 908 are flattened. This smoothing can also be characterized by a difference in the depth of the terminuses of pores 908, as demarcated by lines 1002a and 1002b. In particular, the depth of the terminuses of pores 908 is decreased to about 7 nm. According to some embodiments, the depth of the pore terminus is less than about 10 nm.

Figure 11A:
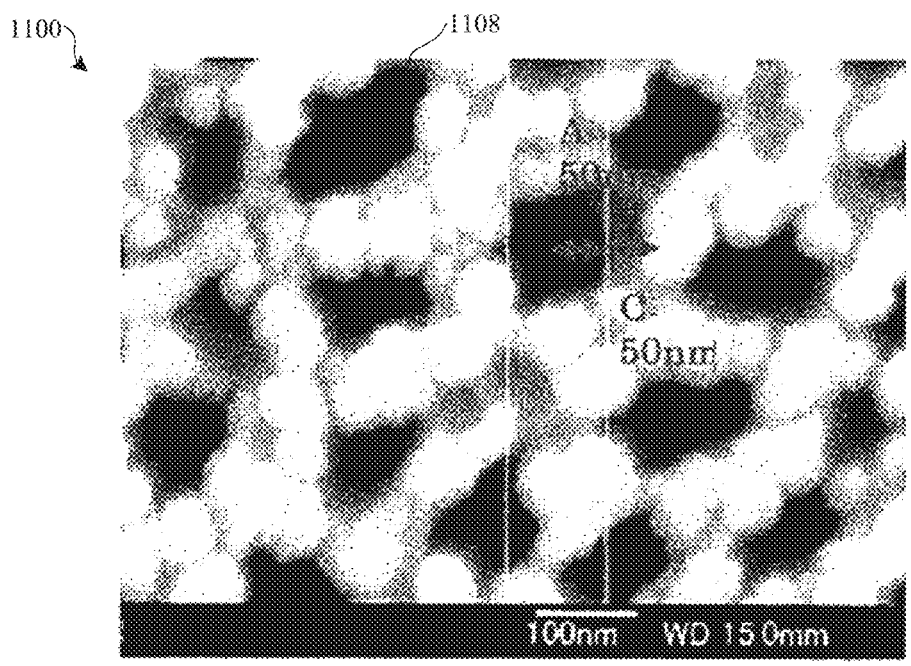
Figure 11B:
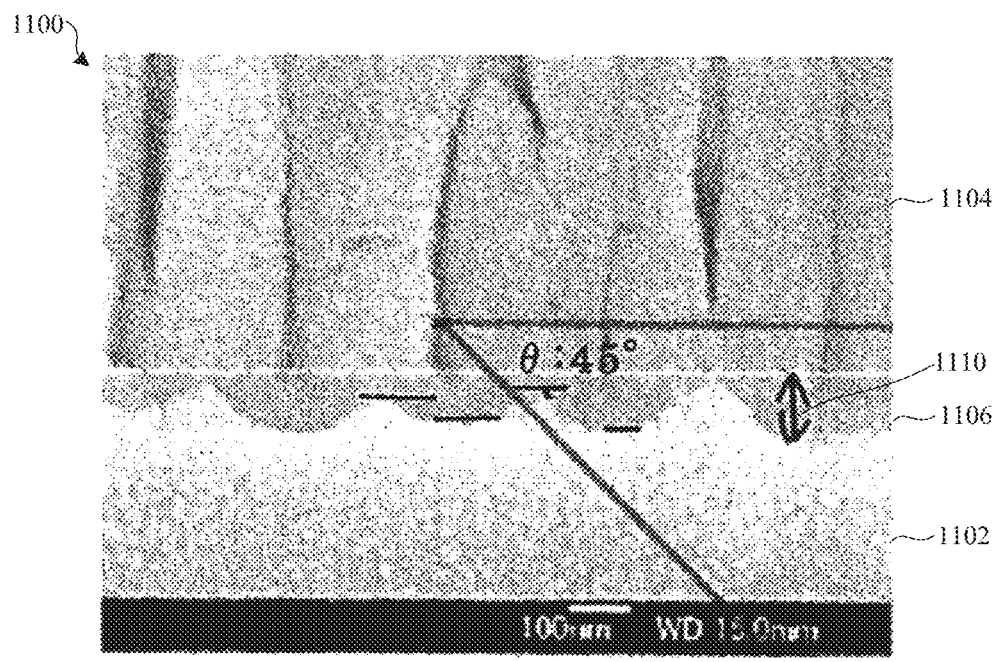

As described above, the chemistry of electrolytic bath and the voltage used during the anodizing process for forming an anodic film (prior to the barrier layer smoothing process) can affect the smoothness of an interface surface between the barrier layer and the porous portion of the anodic film. To illustrate, FIGS. 11A and 11B show top view and cross section SEM images, respectively, of part 1100. Part 1100 includes substrate 1102, anodic film 1104 and barrier layer 1106. Anodic film 1104 was formed using a phosphoric acid-based anodizing process using a voltage of about 100 V. The resulting anodic film 1104 has pores 1108 with diameters around 50 nm and about 100 nm having a pore terminus depth 1110 of about 40 nm and about 76 nm.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. A method of forming an anodic substrate having a white appearance, the method comprising:

forming a first anodic layer that overlays an aluminum alloy substrate by anodizing the aluminum alloy substrate in a first electrolyte, wherein the first anodic layer includes a first porous region defining a first plurality of pores having first diameters, the first porous region being defined by first pore walls that extend from openings in an external surface of the first anodic layer; and forming a second anodic layer, overlaid by the first anodic layer, by anodizing the aluminum alloy substrate in a second electrolyte different than the first electrolyte, the second anodic layer including a second porous region defining a second plurality of pores having second diameters greater than the first diameters, wherein the second porous region shares the openings in the external surface, and is defined by second pore walls contiguous with and thicker than the first pore walls, the second pore walls including light-diffusing surface features.

2. The method of claim 1, further comprising:
forming a barrier layer that is disposed between the aluminum alloy substrate and the second anodic layer.

3. The method of claim 2, wherein a thickness of the barrier layer is between 150 nm to 800 nm.

4. The method of claim 1, wherein the first pores have a columnar shape.

5. The method of claim 1, wherein the first electrolyte includes oxalic acid or sulfuric acid, and the second electrolyte includes phosphoric acid.

6. An anodized substrate having a white appearance for a consumer electronic product, the anodized substrate comprising:
an aluminum alloy substrate;
a first anodic layer overlaying the aluminum alloy substrate and having an external surface, the first anodic layer including a first porous region defining a first plurality of pores having first diameters, wherein the pores of the first plurality of pores are defined by first pore walls and are accessible from openings in the external surface; and
a second anodic layer disposed between the aluminum alloy substrate and the first anodic layer, the second anodic layer including a second porous region defining a second plurality of pores having second diameters greater than the first diameters, wherein the second plurality of pores are accessible via the openings in the external surface, and are defined by second pore walls having light-diffusing surfaces, the second pore walls being thicker than the first pore walls.

7. The anodized substrate of claim 6, wherein the first and second anodic layers have a combined $W_{10}$ value of at least 75.

8. The anodized substrate of claim 6, further comprising:
a barrier layer disposed between the aluminum alloy substrate and the second anodized layer, and the barrier layer has a thickness between 150 nanometers to 800 nanometers.

9. The anodized substrate of claim 6, wherein the light-diffusing surfaces are oriented other than orthogonal to the external surface of the first anodic layer.

10. The anodized substrate of claim 6, wherein the second pore walls are irregular.

11. The anodized substrate of claim 8, wherein the barrier layer has a profile variance of no greater than 6% of a thickness of the barrier layer.

12. The anodized substrate of claim 6, wherein the second porous region is overlaid by the first porous region.

13. The anodized substrate of claim 6, wherein the second porous region extends from the first porous region and towards the aluminum alloy substrate.

14. The anodized substrate of claim 6, wherein the light-diffusing surfaces diffusely reflect visible light incident upon the external surface, thereby imparting the white appearance to the anodized substrate.

15. An anodized part for an electronic device, the anodized part comprising:
an aluminum alloy substrate;
a first anodic layer overlaying the aluminum alloy substrate and having a first porous region that extends from openings in an external surface of the first anodic layer, wherein the first porous region defines a first plurality of pores having first diameters and defined by first pore walls; and
a second anodic layer disposed between the aluminum alloy substrate and the first anodic layer, wherein the second anodic layer includes a second porous region defining a second plurality of pores having second diameters greater than the first diameters, the second plurality of pores sharing the openings in the external surface and being defined by second pore walls that have light-diffusing surface features and are thicker than the first pore walls.

16. The anodized part of claim 15, further comprising:
a non-porous barrier layer disposed between the aluminum alloy substrate and the second anodic layer.

17. The anodized part of claim 15, wherein the first and second anodic layers have an L* value of 80 or higher, a b* value between −3 to +6, and an a* value between −3 to +3.

18. The anodized part of claim 15, wherein the first and second anodic layers have a $W_{10}$ value of at least 75.

19. The anodized substrate of claim 8, wherein a metal oxide particle is infused within at least one of the first or second porous regions.

20. The anodized substrate of claim 6, wherein the first diameters are between 30 nanometers to 100 nanometers.

* * * * *